US006455364B1

United States Patent
Asai et al.

(10) Patent No.: US 6,455,364 B1
(45) Date of Patent: Sep. 24, 2002

(54) SEMICONDUCTOR DEVICE AND METHOD FOR FABRICATING THE SAME

(75) Inventors: Akira Asai; Teruhito Oonishi, both of Osaka; Takeshi Takagi, Kyoto; Tohru Saitoh, Osaka; Yoshihiro Hara, Osaka; Koichiro Yuki, Osaka; Katsuya Nozawa, Osaka; Yoshihiko Kanzawa, Osaka; Koji Katayama, Nara; Yo Ichikawa, Aichi, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/526,686

(22) Filed: Mar. 15, 2000

(30) Foreign Application Priority Data

Mar. 15, 1999 (JP) .......................................... 11-068147

(51) Int. Cl.[7] ........................................ H01L 21/8249
(52) U.S. Cl. ..................................... 438/235; 438/309
(58) Field of Search .............................. 438/184, 188, 438/197, 202, 204, 205, 208, 220, 234, 236, 235, 309, 312, 320, 322, 325, 313

(56) References Cited

U.S. PATENT DOCUMENTS

| 4,252,582 A | | 2/1981 | Anantha et al. ............. 148/175 |
| 4,954,456 A | | 9/1990 | Kim et al. ...................... 357/59 |
| 5,424,227 A | * | 6/1995 | Dietrich et al. .............. 438/202 |
| 5,451,798 A | * | 9/1995 | Tsuda et al. ................. 257/139 |
| 5,854,097 A | * | 12/1998 | Ohmi et al. ................. 438/182 |
| 6,309,940 B1 | * | 10/2001 | Lee ............................. 438/370 |

FOREIGN PATENT DOCUMENTS

WO      WO 98/42019         9/1998

OTHER PUBLICATIONS

D.L. Harame et al., "Si/SiGe Epitaxial–Base Transistors—Part II: Process Integration and Analog Applications", IEEE Transactions on Electron Devices, vol. 42, No. 3, pp. 469–482, Mar. 1995.

* cited by examiner

*Primary Examiner*—David Nelms
*Assistant Examiner*—David Nhu
(74) *Attorney, Agent, or Firm*—Nixon Peabody LLP; Donald R. Studebaker

(57) ABSTRACT

In the method for fabricating a semiconductor device of the present invention, a collector layer of a first conductivity type is formed in a region of a semiconductor substrate sandwiched by device isolation. A collector opening is formed through a first insulating layer deposited on the semiconductor substrate so that the range of the collector opening covers the collector layer and part of the device isolation. A semiconductor layer of a second conductivity type as an external base is formed on a portion of the semiconductor substrate located inside the collector opening, while junction leak prevention layers of the same conductivity type as the external base are formed in the semiconductor substrate. Thus, the active region is narrower than the collector opening reducing the transistor area, while minimizing junction leak.

12 Claims, 17 Drawing Sheets

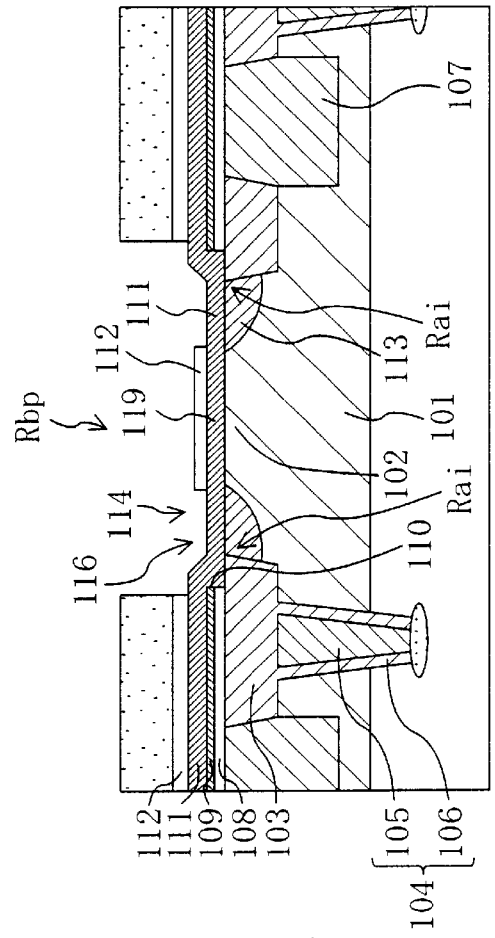
Fig. 9a
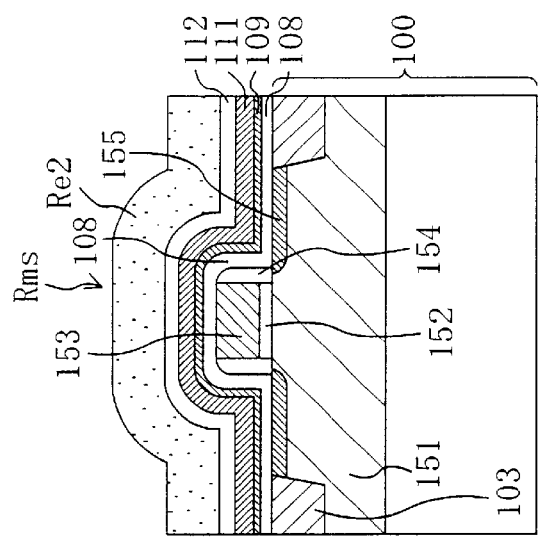
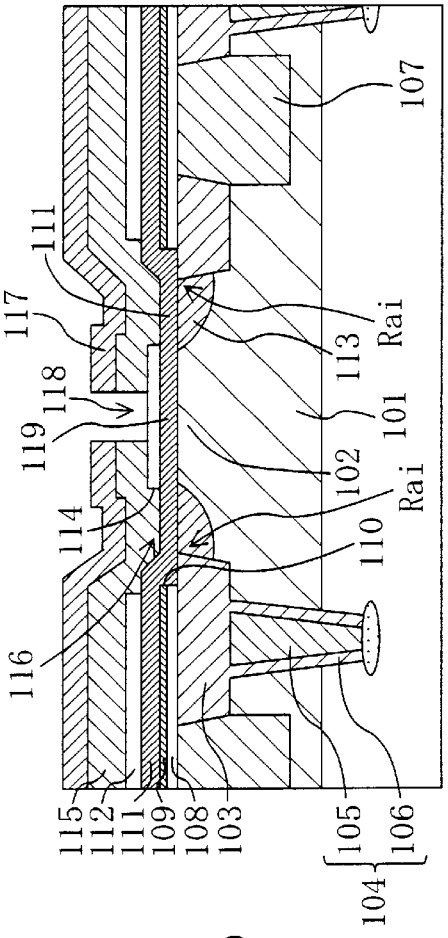
Fig. 9b
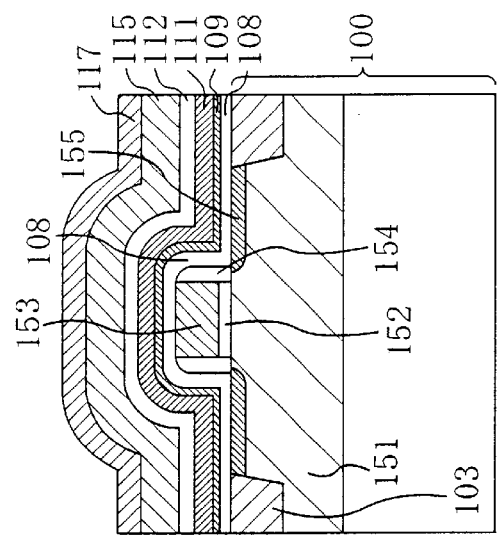

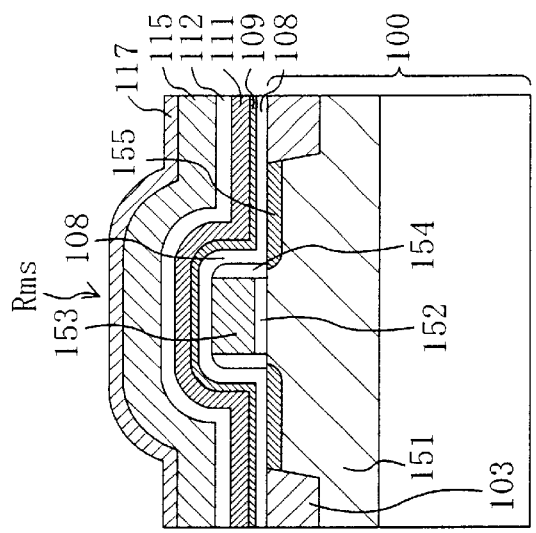
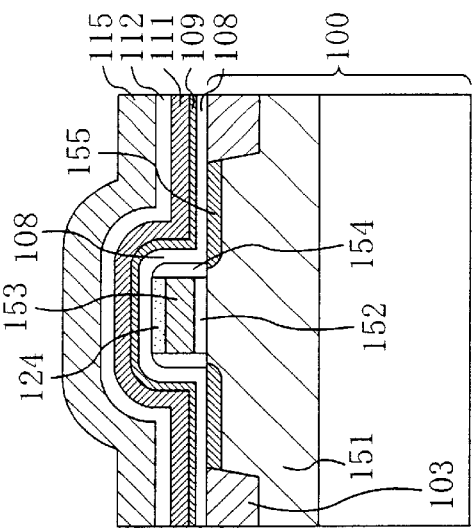
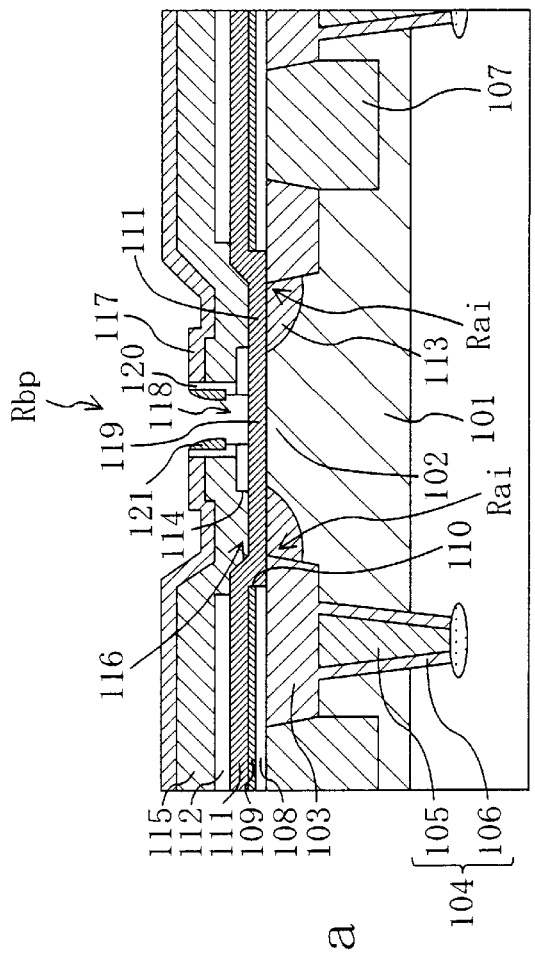
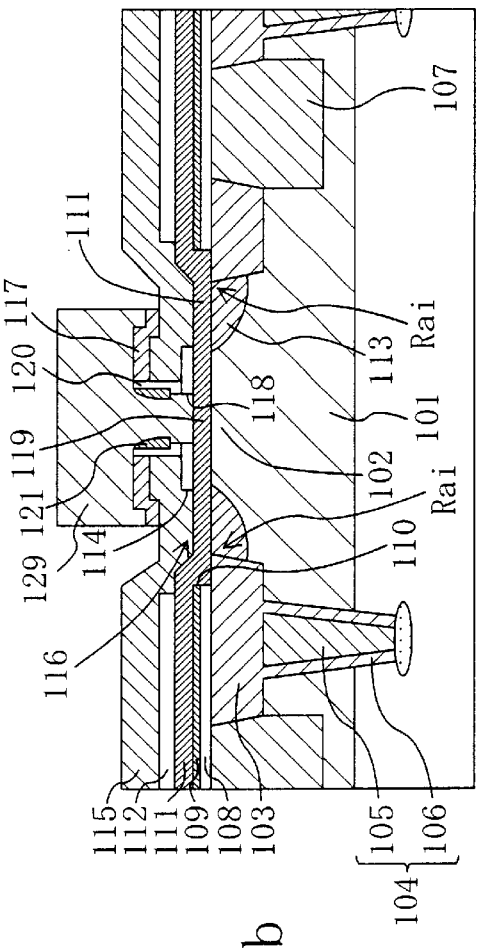
Fig. 10a
Fig. 10b

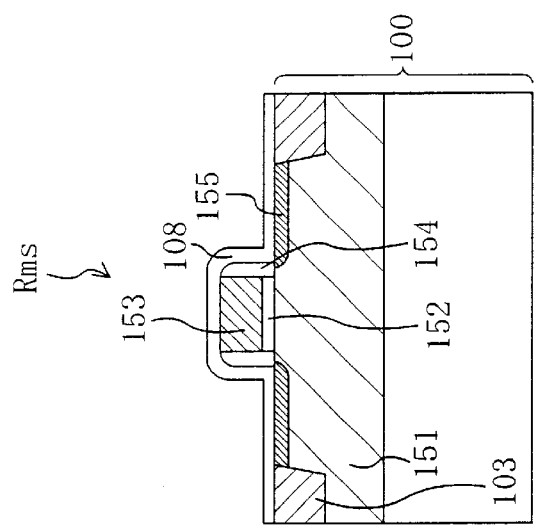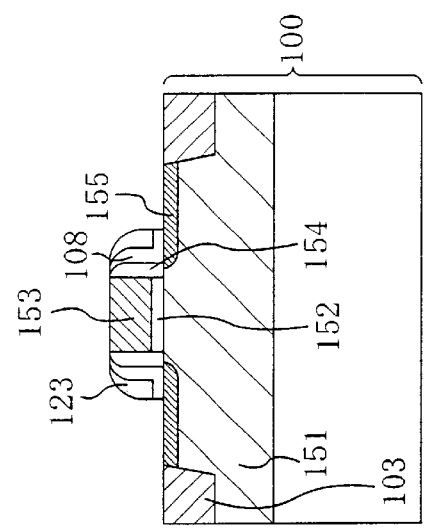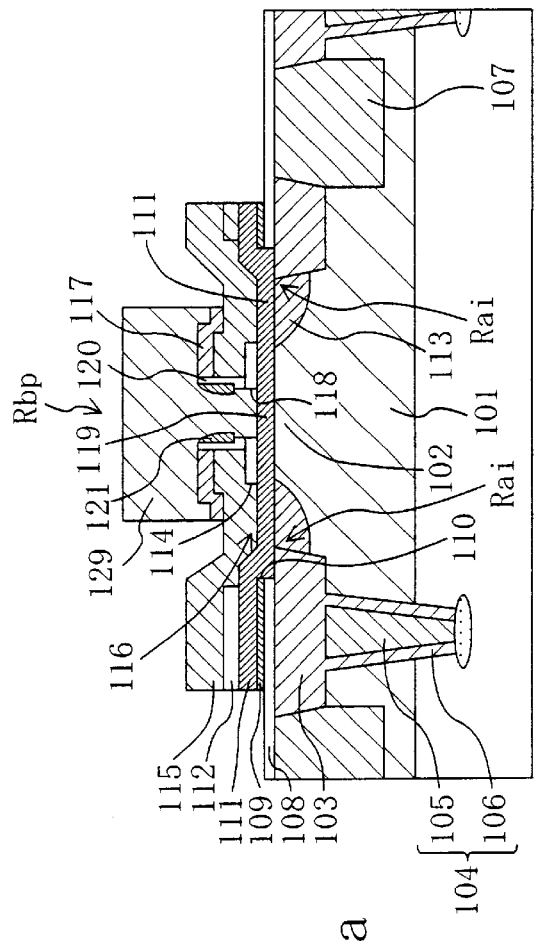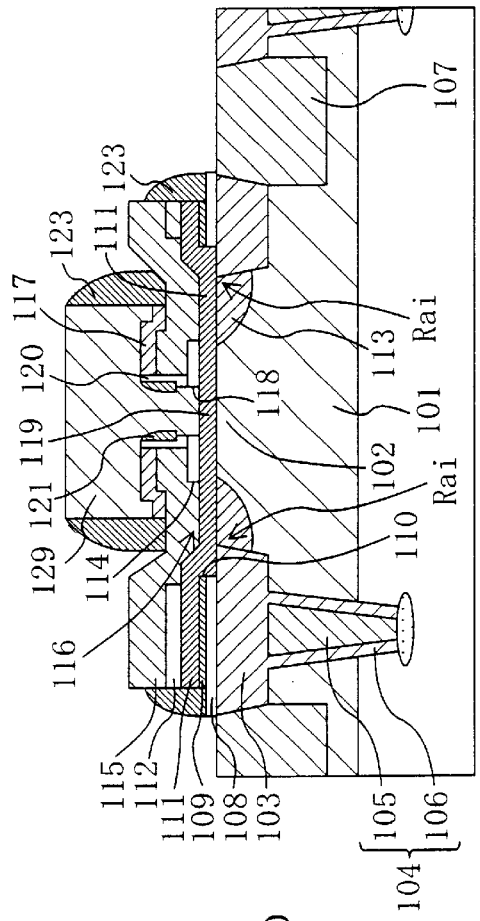
Fig. 11a
Fig. 11b

SEMICONDUCTOR DEVICE AND METHOD FOR FABRICATING THE SAME

BACKGROUND OF THE INVENTION

1. Field of the Invention

The present invention relates to a semiconductor device and a method for fabricating the semiconductor device, and more particularly, relates to a hetero bipolar transistor, a Bi-CMOS device including the hetero bipolar transistor, and method for fabricating such devices.

2. Description of Related Art

In recent years, the development of hetero bipolar transistors (HBT) is in progress at rapid paces. The HBT, which is a bipolar transistor formed on a silicon substrate constituting a heterojunction structure such as Si/SiGe and Si/SiC together with the silicon substrate, is expected to be able to exhibit further improved conductivity characteristics for realizing operation in a higher-frequency range. The HBT is formed by growing a SiGe layer on a Si substrate by epitaxy to form a Si/SiGe heterojunction structure, for example. This heterojunction structure can be utilized to realize a transistor capable of operating in a high-frequency range. Such operation was only possible by transistors using a compound semiconductor substrate such as GaAs. The HBT is composed of materials having good compatibility for general silicon processes, such as the Si substrate and the SiGe layer, thereby providing great advantages of realizing a large scale of integration and low cost. In particular, by integrating such HBT and MOS transistors (MOSFETs) on a common Si substrate, a high-performance Bi-CMOS device can be realized. Such a Bi-COMS device has a great potential as a system LSI applicable in the field of telecommunications.

As a bipolar transistor constituting a Bi-CMOS device, hetero bipolar transistors having a heterojunction structure such as Si/Si$_{1-x}$Ge$_x$ and Si/Si$_{1-y}$C$_y$ have been proposed and prototypes thereof have been fabricated. The HBT of Si/Si$_{1-x}$Ge$_x$ type, among others, is considered promising. As one reason, the band gap can be continuously tuned by utilizing the property that Si and Ge can form an almost complete solid solution together and the property that the band gap changes by applied strain. In order to utilize this advantage, there have been made many proposals on SiGe-BiCMOS devices including Si-MOSFET and HBT of a Si/Si$_{1-x}$Ge$_x$ type formed on a common Si substrate.

In such proposals on SiGe-BiCMOS devices, MOSFET and HBT are generally formed simultaneously. By the simultaneous formation, the process can be simplified. For example, the gate insulating film of the MOSFET can be utilized as a layer for defining the collector opening of the HBT, and the gate electrode of the MOSFET and the base electrode of the HBT can be formed by patterning a common polysilicon film.

For enhancing the performance of MOSFET, high-temperature annealing is required. In the simultaneous formation of MOSFET and HBT described above, however, the annealing temperature must be controlled to avoid the performance of HBT from lowering. This may lower the performance of the MOSFET. Actually, when the performance of the MOSFET of the SiGe-BiCMOS device is compared with that of MOSFET of a standard CMOS device under the same design rule, it has been found that the former is inferior to the latter.

In order to form a high-performance SiGe-BiCMOS device, therefore, it is now considered advantageous to first form MOSFET requiring a high annealing temperature and thereafter form HBT. Also considered advantageous is that since Ge is a contaminant for a standard CMOS device fabrication line, HBT should preferably be formed separately from the MOSFET fabrication process in order to prevent Ge from being mixed in the MOSFET. In particular, if a dedicated fabrication line is not prepared for SiGe-BiCMOS devices, the fabrication process of MOSFET should be definitely separated from that of HBT. In consideration of the above, the procedure of forming first MOSFET and thereafter HBT, not forming MOSFET and HBT simultaneously, would be advantageous in the fabrication process of SiGe-BiCMOS devices.

FIG. 12 is a cross-sectional view of HBT formed in the procedure of forming first MOSFET and thereafter HBT in the conventional fabrication process of SiGe-BiCMOS devices. Referring to FIG. 12, the upper portion of Si (001) substrate 500 constitutes a retrograde well 501 having a depth of 1 μm that contains n-type impurities such as phosphorous introduced therein by epitaxial growth, ion implantation, or the like. The density of the n-type impurities in the surface portion of the Si substrate 500 is adjusted to about $1 \times 10^{17}$ atoms·cm$^{-3}$. As device isolation, there are provided a shallow trench 503 filled with silicon oxide and a deep trench 504 composed of an undoped polysilicon film 505 and a silicon oxide film 506 surrounding the undoped polysilicon film 505. The depth of the shallow trench 503 is about 0.35 μm and that of the deep trench 504 is about 2 μm.

A collector layer 502 is located in the region of the Si substrate 500 sandwiched by the adjacent trenches 503. An n$^+$ collector drawing layer 507 is located in the region of the Si substrate 500 isolated from the collector layer 502 by the shallow trench 503 for connection of the collector layer 502 to an electrode via the retrograde well 501.

A first oxide film 508 having a thickness of about 30 nm is provided on the Si substrate 500. A collector opening 510 is formed through the first oxide film 508. A Si/Si$_{1-x}$Ge$_x$ layer 511a is formed on the portion of the surface of the Si substrate 500 exposed inside the collector opening 510. The Si/Si$_{1-x}$Ge$_x$ layer 511a is composed of a p-type impurity doped Si$_{1-x}$Ge$_x$ layer having a thickness of about 60 nm and a Si layer having a thickness of about 10 nm. The lower portion of the center of the Si/Si$_{1-x}$Ge$_x$ layer 511a (the center corresponds to the lower region of a base opening 518 to be described later) serves as an internal base 519, while the upper portion of the center of the Si/Si$_{1-x}$Ge$_x$ layer S11a serves as an emitter layer.

A second oxide film 512 having a thickness of about 30 nm is provided as an etch stopper on the Si/Si$_{1-x}$Ge$_x$ layer 511a and the first oxide film 508. The second oxide film 512 has base junction openings 514 and the base opening 518. A p$^+$ polysilicon layer 515 having a thickness of about 150 nm is provided over the second oxide film 512 burying the base junction openings 514, and a third oxide film 517 is formed on the p$^+$ polysilicon layer 515. The portion of the Si/Si$_{1-x}$Ge$_x$ layer 511a excluding the lower region of the base opening 518 and the p$^+$ polysilicon layers 515 constitute an external base 516.

An opening is formed through the p$^+$ polysilicon layer 515 and the third oxide film 517 at a position located above the base opening 518 of the second oxide film 512. Fourth oxide films 520 having a thickness of about 30 nm are formed on the side faces of the p$^+$ polysilicon layer 515. On the fourth oxide films 520, sidewalls 521 made of polysilicon having a thickness of about 100 nm are formed. An n$^+$ polysilicon layer 529 is provided on the third oxide film 517 burying the base opening 518. The n$^+$ polysilicon layer 529 serves as an emitter drawing electrode. The fourth oxide films 520 electrically isolate the p+ polysilicon layer 515 from the n+ polysilicon layer 529, as well as blocking the impurities in the p+ polysilicon layer 515 from diffusing to the n+ polysilicon layer 529. The third oxide film 517 electrically isolates the upper surface of the p+ polysilicon layer 515 from the n+ polysilicon layer 529.

Ti silicide layers 524 are formed on the surfaces of the collector drawing layer 507, the p+ polysilicon layer 515, and the n+ polysilicon layer 529. The outer side faces of the n+ polysilicon layer 529 and the p+ polysilicon layer 515 are covered with sidewalls 523. The resultant entire substrate is covered with an interlayer insulating film 525, through which are formed contact holes respectively reaching the n+ collector drawing layer 507, the p+ polysilicon layer 515 as part of the external base, and the n+ polysilicon layer 529 as the emitter drawing electrode. The contact holes are filled with tungsten (W) plugs 526, and metal interconnects 527 extend on the interlayer insulating film 525 so as to be in contact with the W plugs 526.

The width W1 of the base opening 518 is determined by the amount of wet etching of the second oxide film 512 as will be described later. Of the entire base composed of the internal base 519 and the external base 516, the substantial portion forming the pn junction together with the collector layer 502 is the portion of the Si/Si$_{1-x}$Ge$_x$ layer 511a that is in contact with the collector layer 502. The width of this substantial base portion is determined by the width W3 of the collector opening 510 of the first oxide film 508.

The Si$_{1-x}$Ge$_x$ layer is mostly doped with p-type impurities such as boron (B) at about $2 \times 10^{18}$ atoms·cm$^{-3}$, while the Si layer is doped by diffusion of n-type impurities such as phosphorous (P) from the n+ polysilicon layer 529 in the density distribution between $1 \times 10^{20}$ atoms cm$^{-3}$ and $1 \times 10^{17}$ atoms·cm$^{-3}$. The Si layer is formed in succession on the Si$_{1-x}$Ge$_x$ layer so that the lower surface of the overlying n+ polysilicon layer 529 be located farther from the pn junction so as to prevent recombination of carriers from being promoted by a number of interface states and defects existing in the n+ polysilicon layer 529.

The width W2 of the active region is determined by the distance between the adjacent shallow trenches 503. The active region-isolation junctions Rai (junctions between the active region and the device isolation) are junctions between different materials of silicon and silicon oxide, which tend to cause leak current through interface states. The width W2 of the active region is therefore designed to be larger than the width W3 of the collector opening 510 so that the active region-isolation junctions Rai be located outside the range of the collector opening 510 to minimize the influence of the leak current.

SiGe islands 511b exist on the first oxide film 508, which are not deposited intentionally but are aggregates of Si and Ge atoms attached to the first oxide film 508 during the formation of the Si/Si$_{1-x}$Ge$_x$ layer 511a by ultra high vacuum chemical vapor deposition (UHV-CVD) as will be described later.

Hereinafter, the conventional fabrication method of the HBT shown in FIG. 12 will be described with reference to FIGS. 13(a) and 13(b) through 16 that are cross-sectional views illustrating the steps of the fabrication process.

In the step shown in FIG. 13(a), a Si single-crystalline layer is grown by epitaxy while being doped with n-type impurities, or grown by epitaxy followed by ion implantation, to form the n-type retrograde well 501 having a depth of about 1 µm in the upper portion of the Si (001) substrate 500. Alternatively, the retrograde well 501 may be formed by merely implanting ions in part of the Si substrate 500 without involving epitaxial growth. In either case, it is necessary to adjust the density of the n-type impurities to about $1 \times 10^{17}$ atoms cm$^{-3}$ in the surface region of the Si substrate 500 that is to be the collector layer of the HBT.

Thereafter, the shallow trench 503 filled with silicon oxide and the deep trench 504 composed of the undoped polysilicon film 505 and the silicon oxide film 506 surrounding the undoped polysilicon film 505 are formed as the device isolation so as to have depths of about 0.35 µm and 2 µm respectively. The region sandwiched by the adjacent shallow trenches 503 is defined as the collector layer 502. The collector drawing layer 507 for ensuring contact with the electrode of the collector layer 502 via the retrograde well 501 is formed in the region of the Si substrate 500 isolated from the collector layer 502 by the shallow trench 503. In this step, the width W2 of the active region is determined by the distance between the adjacent shallow trenches 503.

Thereafter, a gate insulating film, a gate electrode, and source/drain regions as the basic structure of each MOSFET of the CMOS device are formed by a normal fabrication method although illustration and description of this fabrication are omitted.

In the step shown in FIG. 13(b), the first oxide film 508 is deposited on the wafer to a thickness of about 30 nm by chemical vapor deposition (CVD) using tetraethoxysilane (TEOS) and oxygen at a temperature of 680° C. The first oxide film 508 is then wet-etched with hydrofluoric acid or the like to form the collector opening 510 having the width W3 that is narrower than the width W2 of the active region for the reason described above. The portion of the surface of the Si substrate 500 exposed inside the collector opening 510 is treated with a mixture of ammonium hydroxide and hydro peroxide to form a protection oxide film having a thickness of about 1 nm on the exposed portion. The resultant wafer in this state is placed in a chamber of a UHV-CVD apparatus, where the wafer is heat-treated in a hydrogen atmosphere to remove the protection oxide film and then a gas of disilane (Si$_2$H$_6$) and germane (GeH$_4$) containing diboran (B$_2$H$_6$) for doping is introduced into the chamber while heating to 550° C., to allow the Si$_{1-x}$Ge$_x$ layer to be grown by epitaxy to a thickness of about 60 nm on the exposed surface of the Si substrate 500 inside the collector opening 510. Subsequent to the formation of the Si$_{1-x}$Ge$_x$ layer, the supply gas to the chamber is changed to disilane to grow the Si layer having a thickness of about 10 nm by epitaxy on the Si$_{1-x}$Ge$_x$ layer, thereby forming the Si/Si$_{1-x}$Ge$_x$ layer 511a. At this time, while the Si$_{1-x}$Ge$_x$ layer doped with boron (B) is of the p-type having a boron density of about $2 \times 10^{18}$ atoms·cm$^{-3}$, the Si layer is not doped with impurities. During the formation of the Si$_{1-x}$Ge$_x$ layer, disilane, germane, and diboran are also deposited on the surface of the first oxide film 508, which are however not crystallized but form aggregates of Si and Ge atoms as the SiGe islands 511b.

In the step shown in FIG. 14(a), the second oxide film 512 having a thickness of 30 nm is formed on the resultant wafer, and then patterned by dry etching to form the base junction openings 514. By the formation of the base junction openings 514, the peripheries of the Si/Si$_{1-x}$Ge$_x$ layer 511a and part of the first oxide film 508 are exposed, while the center of the Si/Si$_{1-x}$Ge$_x$ layer 511a is covered with the second oxide film 512. Since the SiGe islands 511b are formed on the first oxide film 508, the surface of the second oxide film 512 deposited on the first oxide film 508 has a considerably uneven profile.

In the step shown in FIG. 14(b), the p⁺ polysilicon layer 515 doped with impurities at a high density of about $1 \times 10^{20}$ atoms·cm⁻³ or more is deposited to a thickness of about 150 nm on the wafer by CVD. Subsequently, the third oxide film 517 is deposited to a thickness of about 100 nm on the resultant wafer. The third oxide film 517 and the p⁺ polysilicon layer 515 are then patterned by dry etching to form the base opening 518 at the centers thereof so as to reach the second oxide film 512. The base opening 518 is made smaller than the center portion of the second oxide film 512 so as not to overlap the base junction openings 514. Thus, in this step, the external base 516 composed of the p⁺ polysilicon layer 515 and the portion of the Si/Si$_{1-x}$Ge$_x$ layer 511a excluding the center thereof is formed. During this step, in general, the side portions of the third oxide film 517 and the p⁺ polysilicon layer 515 as viewed from the figure are also etched away. It should be understood that a larger area of the p⁺ polysilicon layer 515 is left unetched on the left side as viewed from the figure for securing a region for base contact in a later stage.

In the step shown in FIG. 15(a), the fourth oxide film 520 having a thickness of about 30 nm and a polysilicon film having a thickness of about 150 nm are deposited by CVD on the entire surface of the resultant wafer. The polysilicon film is then etched back by anisotropic dry etching to form the sidewalls 521 made of polysilicon on the side faces of the p⁺ polysilicon layer 515 and the third oxide film 517 via the fourth oxide film 520. The wafer is then subjected to wet etching with hydrofluoric acid to remove the exposed portions of the second oxide film 512 and the fourth oxide films 520. By this wet etching, the Si layer of the Si/Si$_{1-x}$Ge$_x$ layer 511a is exposed inside the base opening 518. In addition, since the wet etching is anisotropic, the second oxide film 512 and the fourth oxide film 520 are also etched in the transverse direction, resulting in increasing the size of the base opening 518. The width W1 of the base opening 518 is thus determined by the amount of this wet etching. Moreover, during this wet etching, the portions of the first oxide film 508 that are not covered with the SiGe islands 511b are also etched away, resulting in partly exposing the surface of the n⁺ collector drawing layer 507 and the like.

In the step shown in FIG. 15(b), the n⁺ polysilicon layer 529 having a thickness of about 250 nm is deposited and patterned by dry etching to form the emitter drawing electrode. After the etching, the deposited polysilicon is also left on the side faces of the p⁺ polysilicon layer 515 as sidewalls. During the etching, also, the portions of the surface of the n⁺ collector drawing layer 507 and the like exposed in the step shown in FIG. 15(a) are etched by overetching of the n⁺ polysilicon layer 529, resulting in an uneven surface of the Si substrate 500.

In the step shown in FIG. 16, an oxide film having a thickness of about 120 nm is deposited on the resultant wafer and dry-etched to form the sidewalls 523 on the side faces of the n⁺ polysilicon layer 529 and the p⁺ polysilicon layer 515. By this dry etching, also, the surfaces of the n⁺ polysilicon layer 529, the p⁺ polysilicon layer 515, and the n⁺ collector drawing layer 507 are exposed.

Subsequently, the following processing is performed to obtain the structure shown in FIG. 12. First, Ti is deposited to a thickness of about 40 nm on the entire surface of the resultant wafer by sputtering, and the resultant surface is subjected to RTA (rapid thermal annealing) at 675° C. for 30 seconds to form the Ti silicide layers 524 on the exposed surfaces of the n⁺ polysilicon layer 529, the p⁺ polysilicon layer 515, and the n⁺ collector drawing layer 507. After selective removal of the non-reacted portions of the Ti films, the resultant wafer is annealed to change the crystal structure of the Ti silicide layers 524.

The interlayer insulating film 525 is then formed over the entire surface of the wafer, and the contact holes are formed therethrough to reach the n⁺ polysilicon layer 529, the p⁺ polysilicon layer 515, and the n⁺ collector drawing layer 507. The contact holes are then filled with tungsten (W) films to form the W plugs 526. An aluminum alloy film is then deposited on the entire surface of the wafer and patterned to form the metal interconnects 527 extending on the interlayer insulating film 525 to be connected with the W plugs 526.

By the process described above, the HBT having the structure shown in FIG. 12, that is, the HBT including the collector made of n-type Si, the base made of p⁺-type Si$_{1-x}$Ge$_x$, and the emitter made of n⁺-type Si is realized. It should be noted that the Si layer of the Si/Si$_{1-x}$Ge$_x$ layer 511a has been changed to an n⁺-type Si layer with a high density of n-type impurities (phosphorus, etc.) diffused from the n⁺ polysilicon layer 529.

However, the conventional HBT with the above structure has the following disadvantages.

First, the width W2 of the active region is larger than the width W3 of the collector opening 518 in order to avoid an influence of stress of the shallow trenches 503. The width W3 of the collector opening 518 defines the area of the region that connects the p⁺ polysilicon layer 515 and the Si/Si$_{1-x}$Ge$_x$ layer 511a together serving as the external base 516. Reduction of the width W3 is therefore limited. In addition, the active region/isolation junction Rai that is a junction of different materials has a large stress. If this active region/isolation junction Rai is located closer to the external base 516, the electrical characteristics of the resultant HBT will be adversely influenced by stress-induced leak current and the like.

Secondly, in the step shown in FIG. 13(b), the SiGe islands 511b are formed on the first oxide film 508 during the deposition of the Si/Si$_{1-x}$Ge$_x$ layer 511a on the Si substrate 500. This causes various disadvantages in the aspect of process control in the subsequent steps, such as lowering the flatness of the second oxide film 512 deposited thereon and making the surface of the n⁺ collector drawing layer 507 uneven.

FIGS. 17(a) through 17(c) are cross-sectional views illustrating the formation of the SiGe islands.

Referring to FIG. 17(a), a Si$_{1-x}$Ge$_x$ layer is selectively grown by CVD on the Si substrate 500 with the first oxide film 508 having the collector opening 510 being formed thereon. During an initial predetermined period (incubation time), the Si$_{1-x}$Ge$_x$ layer is selectively grown only on the Si substrate 500 inside the collector opening 510, with no attachment of Si and Ge atoms to the first oxide film 508.

After the incubation time has passed, however, as shown in FIG. 17(b), Si and Ge atoms start to attach to the surface of the first oxide film 508 forming the SiGe islands 511b. Once the Si/Si$_{1-x}$Ge$_x$ layer 511a has been formed by growing the Si layer on the Si$_{1-x}$Ge$_x$ layer by epitaxy, the SiGe islands 511b are left attached to the first oxide film 508.

Alternatively, the SiGe islands 511b may be grown to form a poly-SiGe layer 511c as shown in FIG. 17(c) depending on the conditions of the CVD.

In other words, if the selective growth of the Si$_{1-x}$Ge$_x$ layer can be completed within the incubation time, the Si/Si$_{1-x}$Ge$_x$ layer 511a will be formed without allowing the SiGe islands 511b to be formed on the first oxide film 508.

In general, the incubation time is closely related to the conditions such as the pressure and flow rate of the gas and the growth temperature. Therefore, the conditions for enabling the $Si_{1-x}Ge_x$ layer having a predetermined thickness to be grown selectively only on the Si substrate 500 are extremely strict. Precise control will be required to satisfy the conditions. In practice, therefore, it is difficult to realize stable selective growth of the $Si_{1-x}Ge_x$ layer.

Thirdly, as an incidental disadvantage, in the conventional HBT fabrication process, after the $p^+$ polysilicon layer 515 as part of the external base 516 has been patterned in the step shown in FIG. 14(b), the $n^+$ polysilicon layer 529 serving as the emitter drawing electrode is patterned in the step shown in FIG. 15(b). In the latter patterning, $n^+$ polysilicon is left unetched at the step portions of the existing layers as sidewalls. In addition, the $n^+$ collector drawing layer 507 and the like may be damaged by over-etching. These phenomena may not only lower the process controllability but also cause leak current. In particular, in the fabrication process of a Bi-CMOS device that includes CMOS in addition to HBT on the same substrate, the CMOS may also be damaged.

SUMMARY OF THE INVENTION

An object of the present invention is providing semiconductor devices, serving as a hetero bipolar transistor and a SiGe-BiCMOS device, with a reduced transistor area, reduced leak current, and improved process controllability, and methods for fabricating such semiconductor devices.

The semiconductor device of this invention is a semiconductor device serving as a bipolar transistor formed at an active region of a semiconductor substrate. The device includes: device isolation regions formed in portions of the semiconductor substrate for surrounding the active region; a collector layer of a first conductivity type formed in a region of the semiconductor substrate sandwiched by the device isolation regions; an insulating layer formed on the semiconductor substrate, the insulating layer having a collector opening of which range covers the collector layer and portions of the device isolation regions; a base layer of a second conductivity type formed on the portion of the semiconductor substrate located within the collector opening and on the insulating layer, the base layer including an internal base and an external base surrounding the internal base; and an emitter layer of the first conductivity type formed on the internal base.

With the above construction where the active region is narrower than the collector opening, the area occupied by the transistor can be reduced.

The semiconductor device may further include junction leak prevention layers located in regions of the semiconductor substrate right under the external base and adjacent to the device isolation regions, the junction leak prevention layers including impurities of the second conductivity type. With this construction, the pn junction becomes farther from the junctions between the active layer and the device isolation regions, thereby minimizing generation of leak current through interface states or lattice defect due to stress applied to the junctions between the active layer and the device isolation regions.

The first method for fabricating a semiconductor device of this invention is a fabrication method of a semiconductor device serving as a bipolar transistor having an emitter layer, a base layer, and a collector layer formed at an active region of a semiconductor substrate. The method includes the steps of: (a) forming device isolation regions in portions of the semiconductor substrate for surrounding the active region; (b) forming a collector layer of a first conductivity type in a region of the semiconductor substrate sandwiched by the device isolation regions; (c) after the steps (a) and (b), depositing a first insulating layer on the semiconductor substrate and then forming a collector opening through a portion of the first insulating layer so that the range of the collector opening covers the collector layer and portions of the device isolation regions; and (d) forming a semiconductor layer of a second conductivity type on the portion of the semiconductor substrate located inside the collector opening for defining at least an internal base and an external base surrounding the internal base.

By the above method, a bipolar transistor with a reduced occupying area can be easily fabricated.

The method may further includes the steps of: (e) after the step (d), forming a second insulating layer on the semiconductor substrate, and then forming base junction openings by removing portions of the second insulating layer ranging from positions located above peripheries of the semiconductor layer to positions located above inner ends of the device isolation regions while remaining a portion of the second insulating layer located above a center of the semiconductor layer, by etching using a patterned photoresist; and (f) forming junction leak prevention layers by introducing impurities of the second conductivity type in regions of the semiconductor substrate located under the base junction openings. This method makes it possible to fabricate a semiconductor device that can minimize generation of leak current due to stress applied to the junctions between the active layer and the device isolation regions.

Alternatively, the method may further include the steps of: (e) after the step (d), forming a second insulating layer on the semiconductor substrate, and then forming base junction openings by removing portions of the second insulating layer located above peripheries of the semiconductor layer while remaining a portion of the second insulating layer located above a center of the semiconductor layer, by etching using a patterned photoresist; (f) depositing a first conductor layer and a third insulating layer on the semiconductor substrate, and then forming a base opening through the first conductor layer and the third insulating layer to reach a portion of the second insulating layer left on the internal base; (g) forming a fourth insulating layer covering a side face of the first conductor layer exposed in the base opening; (h) removing a portion of the second insulating layer left on the internal base of the semiconductor layer exposed inside the base opening to expose a portion of the semiconductor layer on the bottom of the base opening; (i) after the step (h), forming a second conductor layer burying the base opening; and (j) after the step (i), removing side portions of the first conductor layer and the third insulating layer by etching to expose a portion of the semiconductor substrate to be used as a collector drawing layer. This method makes it possible to fabricate a semiconductor device that can prevent problems such as generation of leak current due to residues of the material for the second conductor layer left on the side faces of the first conductor layer as sidewalls.

The second method for fabricating a semiconductor device of this invention is a fabrication method of a semiconductor device including a bipolar transistor having at least an emitter layer, a base layer, and a collector layer and MISFET having at least a gate insulating film, a gate electrode, and source/drain regions, formed on a semiconductor substrate. The method includes the steps of: (a) forming the collector layer of the bipolar transistor in a bipolar transistor formation region and forming the gate insulating film, the gate electrode, and the source/drain regions of the MISFET in a MISFET formation region; (b) depositing a first insulating layer and a reductive film on the semiconductor substrate, and then removing a portion of the first insulating layer and the reductive film located above the collector layer in the bipolar transistor formation region to form a collector opening; and (c) growing by epitaxy a semiconductor layer of a second conductivity type on a portion of the semiconductor substrate located inside the collector opening and the reductive film for forming at least an internal base and an external base surrounding the internal base.

By the above method, the semiconductor film is grown roughly uniformly on the reductive film on the first insulating layer irrespective of whether selective epitaxial growth conditions or non-selective epitaxial growth conditions are employed for the growth of the semiconductor layer. As a result, disadvantages caused by islands of the semiconductor film that may otherwise be formed can be overcome.

In the step (c), the semiconductor layer may be formed so as to include at least one of $Si_{1-x}Ge_x$ ($0 \leq x \leq 1$), $Si_{1-x-y}Ge_xC_y$ ($0 \leq x+y \leq 1$), and $Si_{1-y}C_y$ ($0 \leq y \leq 1$). With such a semiconductor layer, the resultant hetero bipolar transistor is excellent in high-frequency characteristics and capable of sharing the fabrication process with a silicon device.

In the step (b), the reductive film is preferably formed to include one material selected from the group consisting of polysilicon, amorphous silicon, and silicon nitride.

The method may further include the steps of: (d) after the step (c), forming a second insulating layer on the semiconductor substrate, and then removing portions of the second insulating layer located above peripheries of the semiconductor layer while remaining a portion of the second insulating layer located above a center of the semiconductor layer to form base junction openings; (e) depositing a first conductor layer and a third insulating layer on the semiconductor substrate, and then forming a base opening through portions of the first conductor layer and the third insulating layer to reach a portion of the second insulating layer left on the internal base; (f) forming an inter-electrode insulating layer covering a side face of the first conductor layer exposed in the base opening; (g) removing a portion of the second insulating layer left on the internal base of the semiconductor layer exposed in the base opening by etching to expose a portion of the semiconductor layer on the bottom of the base opening; (h) forming a second conductor layer to be used as an emitter drawing electrode burying the base opening; (i) removing part of the third insulating layer, the first conductor layer, the semiconductor layer, and the reductive film in the bipolar transistor formation region, and the entire of the third insulating layer, the first conductor layer, the semiconductor layer, and the reductive film in the MISFET formation region; (j) after the step (i), depositing an insulating film on the semiconductor substrate and etching back the insulating film to form sidewalls on side faces of the first conductor layer, the semiconductor layer, and the reductive film in the bipolar transistor formation region and on the side faces of the gate electrode in the MISFET formation region; and (k) removing the first insulating layer to expose portions of the semiconductor substrate to be used as a collector drawing layer in the bipolar transistor formation region and the source/drain regions in the MISFET formation region. This ensures to prevent the MISFET formation region and the like from being polluted with Ge and the like.

The steps (j) and (k) are preferably performed simultaneously.

At least one of the insulating layers may comprise a silicon oxide film formed at a temperature of 700° C. or lower. This minimizes degradation of the impurity density profile of the relevant components of the semiconductor device.

In the step (c), the semiconductor layer may be formed by sequentially depositing a layer made of at least one of $Si_{1-1}Ge_x$ ($0 \leq x \leq 1$), $Si_{1-y}Ge_xC_y$ ($0 \leq x+y \leq 1$), and $Si_{1-y}C_y$ ($0 \leq y \leq 1$) and a Si layer, and the method may further include the steps of: (d) after the step (c), forming a second insulating layer on the semiconductor substrate, and then removing portions of the second insulating layer located above peripheries of the semiconductor layer while remaining a portion of the second insulating layer located above a center of the semiconductor layer to form base junction openings; (e) depositing a first conductor layer and a third insulating layer on the semiconductor substrate, and then forming a base opening through portions of the first conductor layer and the third insulating layer to reach a portion of the second insulating layer left on the internal base; (f) forming an inter-electrode insulating layer covering a side face of the first conductor layer exposed in the base opening; (g) removing a portion of the second insulating layer left on the internal base of the semiconductor layer exposed in the base opening by etching to expose a portion of the semiconductor layer on the bottom of the base opening; (h) after the step (g), forming a second conductor layer to be used as an emitter drawing electrode burying the base opening; and (i) diffusing impurities of a first conductivity type to part of the Si layer from the second conductor layer to form an emitter layer in the Si layer.

The above method ensures formation of the emitter layer including a high density of impurities of the first conductivity type.

BRIEF DESCRIPTION OF THE DRAWINGS

FIGS. 9(a) and 9(b) are cross-sectional views illustrating the steps of forming a base opening through a p+ polysilicon layer in the fabrication process of the semiconductor device of EMBODIMENT 2.

FIGS. 10(a) and 10(b) are cross-sectional views illustrating the steps of forming a n+ polysilicon layer in the base opening in the fabrication process of the semiconductor device of EMBODIMENT 2.

FIGS. 11(a) and 11(b) are cross-sectional views illustrating the steps of patterning the side faces of the p+ polysilicon layer in the fabrication process of the semiconductor device of EMBODIMENT 2.

DESCRIPTION OF THE PREFERRED EMBODIMENTS

Hereinafter, preferred embodiments of the present invention will be described with reference to the accompanying drawings.

Embodiment 1

Figure 1:
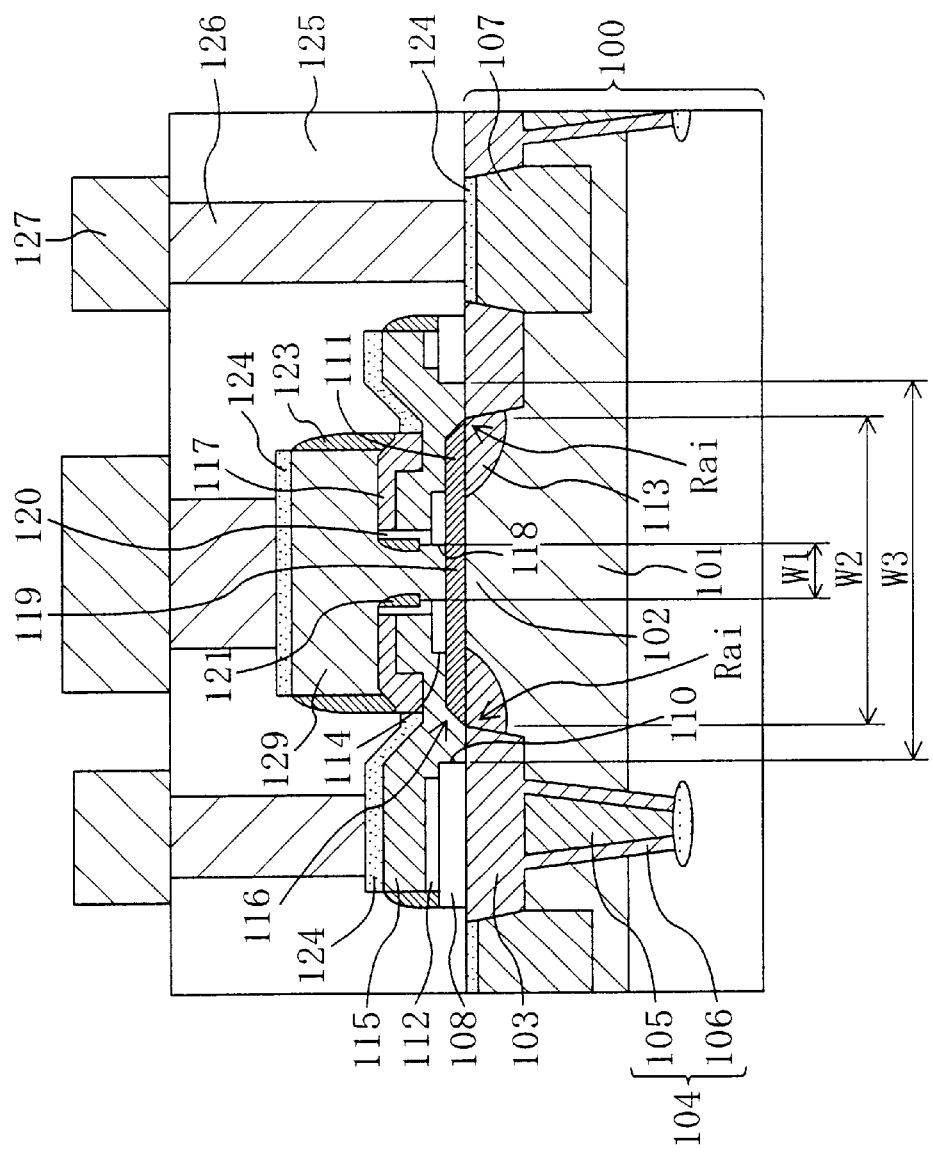
FIG. 1 is a cross-sectional view of a bipolar transistor of a semiconductor device of EMBODIMENT 1 according to the present invention.

FIG. 1 is a cross-sectional view of a semiconductor device of EMBODIMENT 1 according to the present invention, particularly illustrating a hetero bipolar transistor (HBT) fabricated by a fabrication process of a SiGe-BiCMOS device in the procedure of forming first MISFET and thereafter HBT.

Referring to FIG. 1, the upper portion of a Si (001) substrate 100 constitutes a retrograde well 101 having a depth of 1 μm that contains n-type impurities such as phosphorous introduced therein by epitaxial growth, ion implantation, or the like. The density of the n-type impurities in the surface portion of the Si substrate 100 is adjusted to about $1\times10^{17}$ atoms·cm$^{-3}$. As device isolation, there are provided a shallow trench 103 filled with silicon oxide and a deep trench 104 composed of an undoped polysilicon film 105 and a silicon oxide film 106 surrounding the undoped polysilicon film 105. The thickness of the shallow trench 103 is about 0.35 m and that of the deep trench 104 is about 2 μm.

A collector layer 102 extends the region of the Si substrate 100 sandwiched between the adjacent trenches 103. An n+ collector drawing layer 107 is located in the region of the Si substrate 100 isolated from the collector layer 102 by the shallow trench 103 for securing contact with an electrode of the collector layer 102 via the retrograde well 101.

A first oxide film 108 having a thickness of about 30 nm is provided on the Si substrate 100. A collector opening 110 is formed through the first oxide film 108. A $Si/Si_{1-x}Ge_x$ layer 111 is formed on the portion of the surface of the Si substrate 100 exposed inside the collector opening 110. The $Si/Si_{1-x}Ge_x$ layer 111 is composed of a p-type impurity doped $Si_{1-x}Ge_x$ layer having a thickness of about 60 nm and a Si layer having a thickness of about 10 nm. The $Si/Si_{1-x}Ge_x$ layer 111 exists only on the portion of the surface of the Si substrate 100 exposed inside the collector opening 110 by selective growth. The lower portion of the center of the $Si/Si_{1-x}Ge_x$ layer 111 (the center corresponds to a lower region of a base opening 118 to be described later) serves as an internal base 119, while the upper portion of the center of the $Si/Si_{1-x}Ge_x$ layer 111 serves as an emitter layer. The $Si_{1-x}Ge_x$ layer is mostly doped with p-type impurities such as boron (B) at about $2\times10^{18}$ atoms·cm$^{-3}$ while the Si layer is doped by diffusion of n-type impurities such as phosphorous (P) from an n+ polysilicon layer 129 to be described later in the density distribution between $1\times10^{20}$ atoms·cm$^{-3}$ and $1\times10^{17}$ atoms·cm$^{-3}$. The Si layer is formed in succession on the $Si_{1-x}Ge_x$ layer so that the lower surface of the overlying n+ polysilicon layer 129 be located farther from the pn junction so as to prevent recombination of carriers from being promoted by a number of interface states and defects existing in the n+ polysilicon layer 129.

The width W1 of the base opening 118 is determined by the amount of wet etching of a second oxide film 112 to be described later. Of the entire base composed of the internal base 119 and the external base 116, the substantial portion forming the pn junction together with the collector layer 102 is the portion of the $Si/Si_{1-x}Ge_x$ layer 111 that is in contact with the collector layer 102. The width of this substantial base portion is determined by the width W3 of the collector opening 110 of the first oxide film 108.

In this embodiment, the inner ends of the shallow trenches 103 are located at positions closer to the center of the HBT than the peripheries of the collector opening 110, so that the width W2 of the active region is smaller than the width W3 of the collector opening 110. With the shallow trenches 103 being closer to each other, the entire area of the HBT can. be reduced. Meanwhile, this arrangement results in that the active region-isolation junctions Rai exist inside a carrier migration region of the HBT. This may cause problems such as generation of a defect due to stress. In order to avoid such problems, p-type junction leak prevention layers 113 are provided in the vicinity of the active region-isolation junctions Rai by implanting p-type impurities in a self-aligned manner with respect to the collector opening 110. The density of the impurities in the surface portions of the p-type junction leak prevention layers 113 is preferably about $3\times10^{17}$ atoms·cm$^{-3}$.

The second oxide film 112 having a thickness of about 30 nm exists as an etch stopper on the $Si/Si_{1-x}Ge_x$ layer 111 and the first oxide film 108. The second oxide film 112 has base junction openings 114 and the base opening 118. A p+ polysilicon layer 115 having a thickness of about 150 nm is provided over the second oxide film 112 burying the base junction openings 114, and a third oxide film 117 is provided on the p+ polysilicon layer 115. The portion of the $Si/Si_{1-x}Ge_x$ layer 111 excluding the lower region of the base opening 118 and the p+ polysilicon layer 115 constitute the external base 116.

An opening is formed through the p+ polysilicon layer 115 and the third oxide film 117 at a portion located above the base opening 118 of the second oxide film 112. Fourth oxide films 120 having a thickness of about 30 nm are provided on the side faces of the p+ polysilicon layer 115. On the fourth oxide films 120, sidewalls 121 made of polysilicon having a thickness of about 100 nm are provided. The n+ polysilicon layer 129 extends over the third oxide film 117 burying the base opening 118. The n+ polysilicon layer 129 serves as an emitter drawing electrode. The fourth oxide films 120 electrically isolate the p+ polysilicon layer 115 from the n+ polysilicon layer 129, as well as blocking the impurities in the p+ polysilicon layer 115 from diffusing to the n+ polysilicon layer 129. The third oxide film 117 electrically isolates the upper surface of the p+ polysilicon layer 115 from the n+ polysilicon layer 129. The outer side faces of the n+ polysilicon layer 129 and the p+ polysilicon layer 115 are covered with sidewalls 123.

Figure 12:
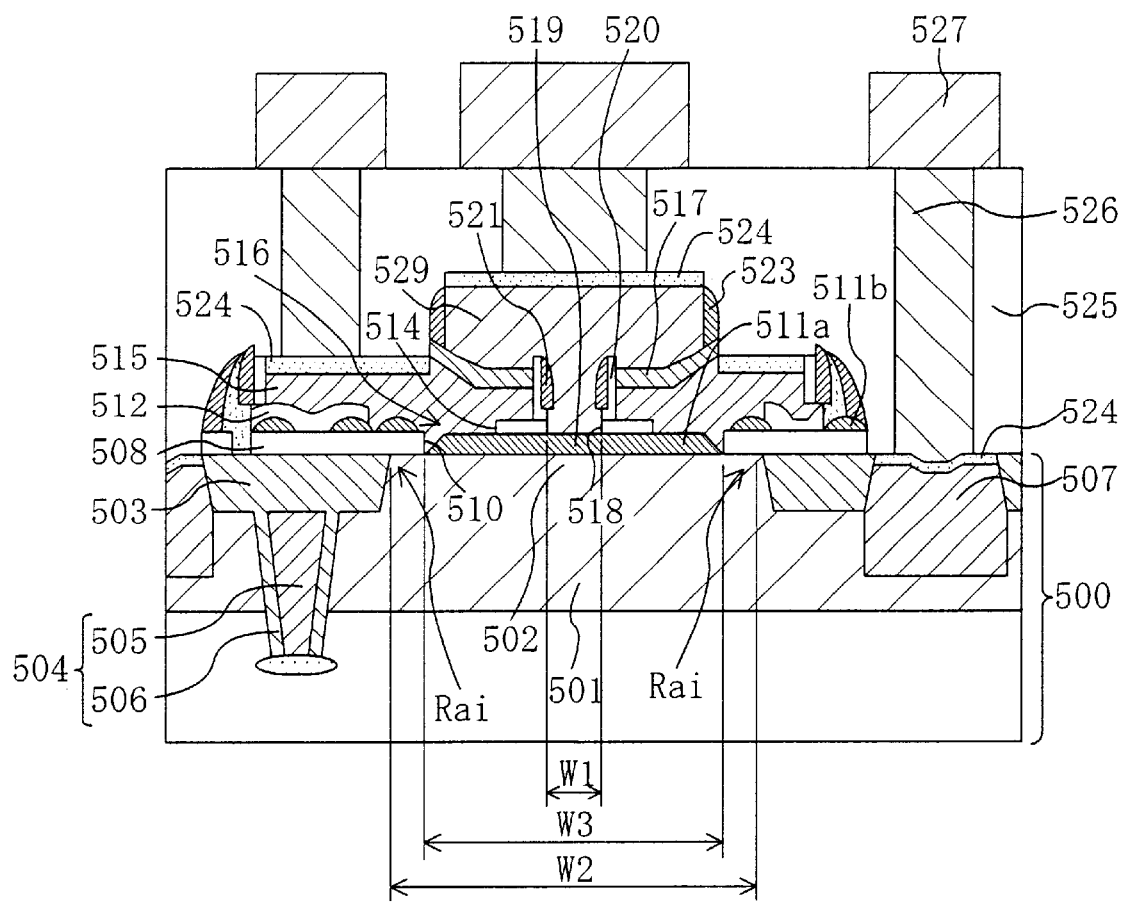
FIG. 12 is a cross-sectional view of a conventional bipolar transistor.

Ti silicide layers 124 are provided on the surfaces of the collector drawing layer 107, the p+ polysilicon layer 115, and the n+ polysilicon layer 129. The outer side faces of the n+ polysilicon layer 129 and the p+ polysilicon layer 115 are different from those of the conventional HBT structure shown in FIG. 12. This is due to the difference in the order of patterning of the p+ polysilicon layer 115 and the n+ polysilicon layer 129 as will be described later. In this embodiment, with the structure described above, generation of a damage in the n+ collector drawing layer 107 and the like can be effectively prevented as will be described later.

The resultant entire substrate is covered with an interlayer insulating film 125, through which are formed contact holes respectively reaching the n+ collector drawing layer 107, the p+ polysilicon layer 115 as part of the external base, and the n+ polysilicon layer 129 as the emitter drawing electrode. The contact holes are filled with W plugs 126, and metal interconnects 127 extend on the interlayer insulating film 125 so as to be in contact with the W plugs 126.

The values shown herein as the thickness of the respective layers represent typical values. In practice, an appropriate thickness may be used depending on the kind and use of the HBT.

Hereinafter, the fabrication process for realizing the structure shown in FIG. 1 will be described with reference to FIGS. 2(a) and 2(b) through 5(a) and 5(b), which are cross-sectional views of the HBT of the SiGe-BiCMOS of EMBODIMENT 1 illustrating the respective steps of the fabrication method thereof.

Figure 2A:
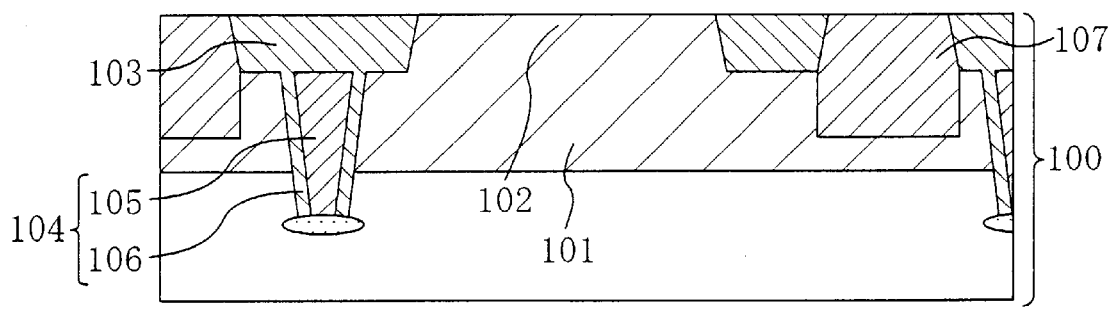
FIGS. 2(a) and 2(b) are cross-sectional views illustrating the steps of forming a $Si/Si_{1-1}Ge_x$ layer in a collector opening in the fabrication process of the semiconductor device of EMBODIMENT 1.

In the step shown in FIG. 2(a), an Si single-crystalline layer is grown by epitaxy while being doped with n-type impurities, or grown by epitaxy followed by high-energy ion implantation, to form the n-type retrograde well 101 having a depth of about 1 $\mu$m in the upper portion of the Si (001) substrate 100. Alternatively, the retrograde well 501 may be formed by merely implanting ions in part of the Si substrate 100 without involving epitaxial growth. In either case, the density of the n-type impurities in the surface region of the Si substrate 100 should be adjusted to about $1\times10^{17}$ atoms·cm$^{-3}$ so that the surface region can serve as the collector layer of the HBT.

Thereafter, the shallow trench 103 filled with silicon oxide and the deep trench 104 composed of the undoped polysilicon film 105 and the silicon oxide film 106 surrounding the undoped polysilicon film 105 are formed as the device isolation so as to have depths of about 0.35 $\mu$m and 2 $\mu$m respectively. The region sandwiched by the adjacent shallow trenches 103 is defined as the collector layer 102. The n+ collector drawing layer 107 is formed in the region of the Si substrate 100 isolated from the collector layer 102 by the shallow trench 103 for securing contact with a collector electrode. In this step, the width W2 of the active region is determined by the distance between the adjacent shallow trenches 103. In this embodiment, the width W2 of the active region is made smaller than that of the conventional HBT.

Thereafter, a gate insulating film, a gate electrode, source/drain regions, and the like as the basic structure of each MISFET (metal-insulator semiconductor field effect transistor) of the CMOS device are formed by a normal fabrication method although illustration and description of this fabrication are omitted.

Figure 2B:
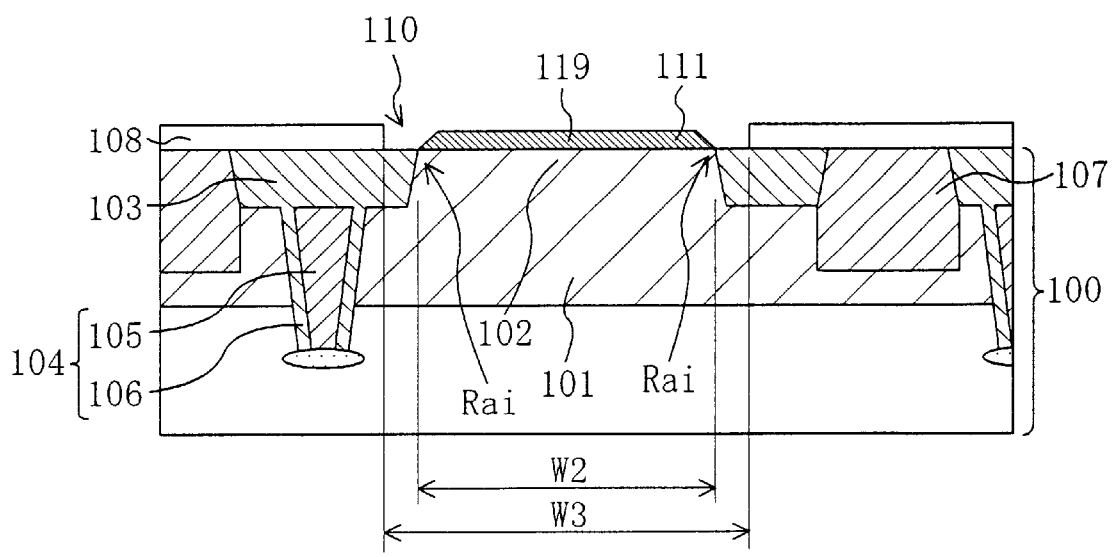

In the step shown in FIG. 2(b), the first oxide film 108 is deposited to a thickness of about 30 nm on the wafer by CVD using tetraethoxysilane (TEOS) and oxygen at a temperature of 680° C. The first oxide film 108 is then wet-etched with hydrofluoric acid or the like to form the collector opening 110 having the width W3 that is larger than the width W2 of the active region. That is, the collector opening 110 is made wider than the active region by forming the collector opening 110 so that the active region-isolation junctions Rai (boundaries between the shallow trenches 103 and the surface portion of the Si substrate 100) are located within the range of the collector opening 110. In fact, the width of the collector opening 110 is substantially the same as that of the conventional HBT. As a result that the distance between the shallow trenches 103 is made smaller than that of the conventional HBT, the width W3 of the collector opening 110 becomes relatively larger than the width W2 of the active region. This arrangement however may cause the problem of increased base-collector leak current through interface states or lattice defects due to stress generated at the junction of different materials if no measures are taken. In order to avoid this problem, the junction leak prevention layers 113 are formed as will be described later.

The portion of the surface of the Si substrate 100 exposed inside the collector opening 110 is treated with a mixture of ammonium hydroxide and hydro peroxide to form a protection oxide film having a thickness of about 1 nm on the exposed portion. The resultant wafer in this state is placed in a chamber of a UHV-CVD apparatus, where the wafer is heat-treated in a hydrogen atmosphere to remove the protection oxide film and then a gas of disilane ($Si_2H_6$) and germane ($GeH_4$) containing diboran ($B_2H_6$) for doping is introduced into the chamber while heating to 550° C., to allow the $Si_{1-x}Ge_x$ layer to be grown by epitaxy to a thickness of about 60 nm on the exposed surface of the Si substrate 100 inside the collector opening 110. Subsequent to the formation of the $Si_{1-x}Ge_x$ layer, the supply gas to the chamber is changed to disilane, to grow the Si layer having a thickness of about 10 nm by epitaxy on the $Si_{1-x}Ge_x$ layer, thereby forming the Si/$Si_{1-x}Ge_x$ layer 111. At this time, while the $Si_{1-x}Ge_x$ layer doped with boron (B) is of the p-type having a boron density of about $2\times10^{18}$ atoms·cm$^{-3}$, the Si layer is not doped with impurities. As in the conventional fabrication process, during the formation of the $Si_{1-x}Ge_x$ layer, Si and Ge atoms may also be deposited on the surface of the first oxide film 108 forming SiGe islands. Such formation of SiGe islands is however avoided by strictly controlling the selective growth in this embodiment.

Figure 3A:
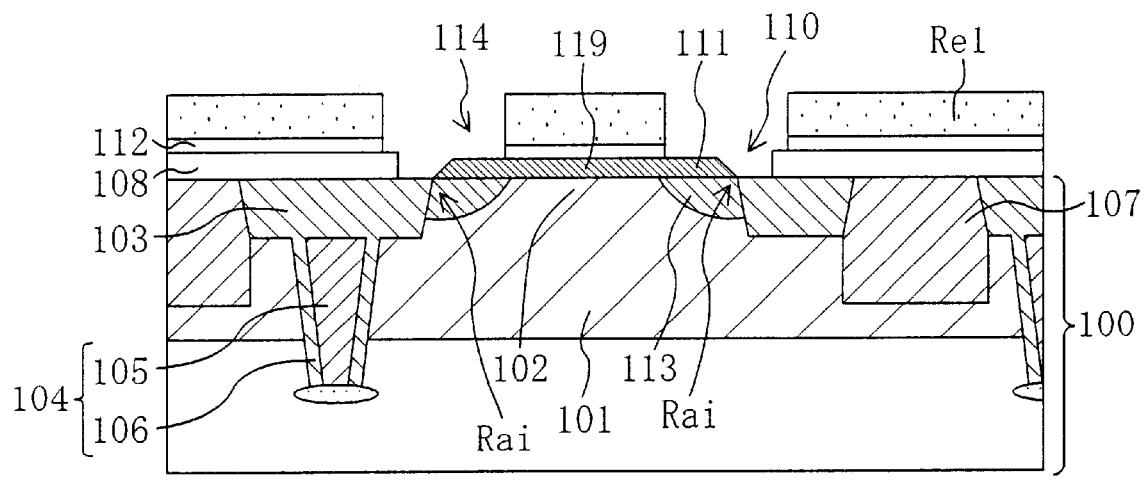
FIGS. 3(a) and 3(b) are cross-sectional views illustrating the steps of forming a base opening through a $p^+$ polysilicon layer in the fabrication process of the semiconductor device of EMBODIMENT 1.

In the step shown in FIG. 3(a), the second oxide film 112 having a thickness of 30 nm as an etch stopper is formed on the resultant wafer, and then patterned by dry etching using a resist mask Re1 formed on the second oxide film 112 to form the base junction openings 114. As a result, the center of the Si/$Si_{1-x}Ge_x$ layer 111 is covered with the second oxide film 112, while the peripheries of the Si/$Si_{1-x}Ge_x$ layer 111 and part of the first oxide film 108 are exposed inside the base junction openings 114. Thereafter, p-type impurities such as boron (B) are implanted using the resist mask Re1 used for the formation of the base junction openings 114, to form the junction leak prevention layers 113 having a density of the impurities of about $3\times10^{17}$ atoms·cm$^{-3}$ in the surface portion as the measures for minimizing the influence of stress at the active region-isolation junctions Rai.

Figure 3B:
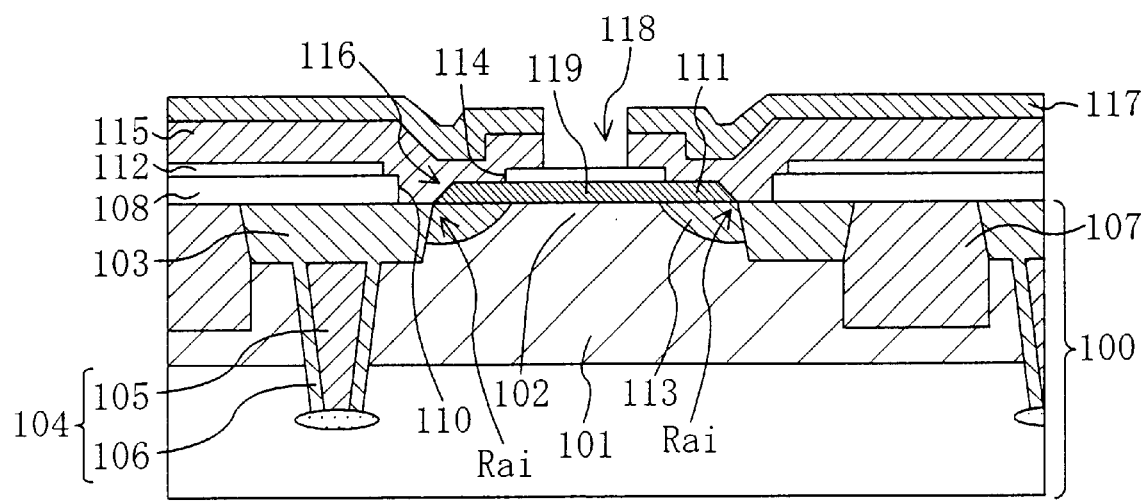
Figure 14A:
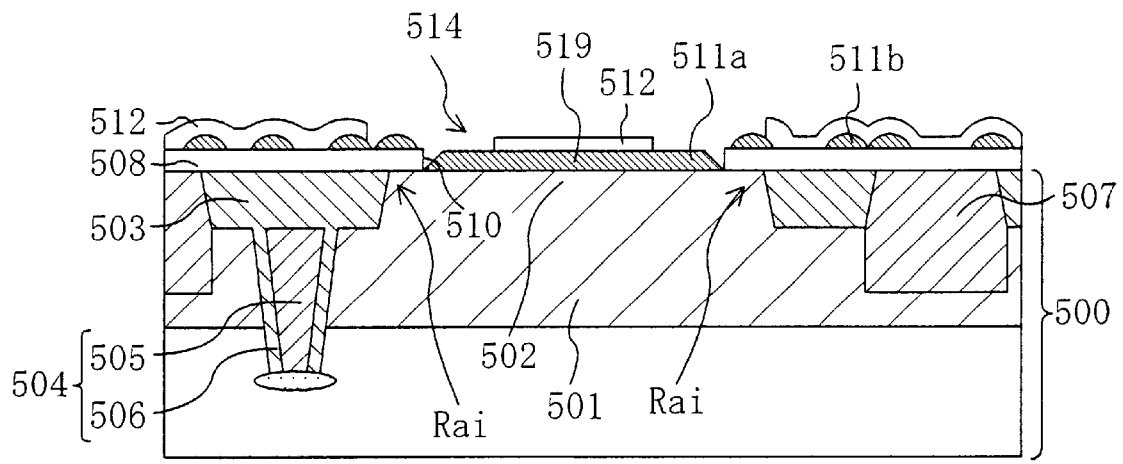
FIGS. 14(a) and 14(b) are cross-sectional views illustrating the steps of forming a base opening through a p+ polysilicon layer in the fabrication process of the conventional semiconductor device.
Figure 14B:
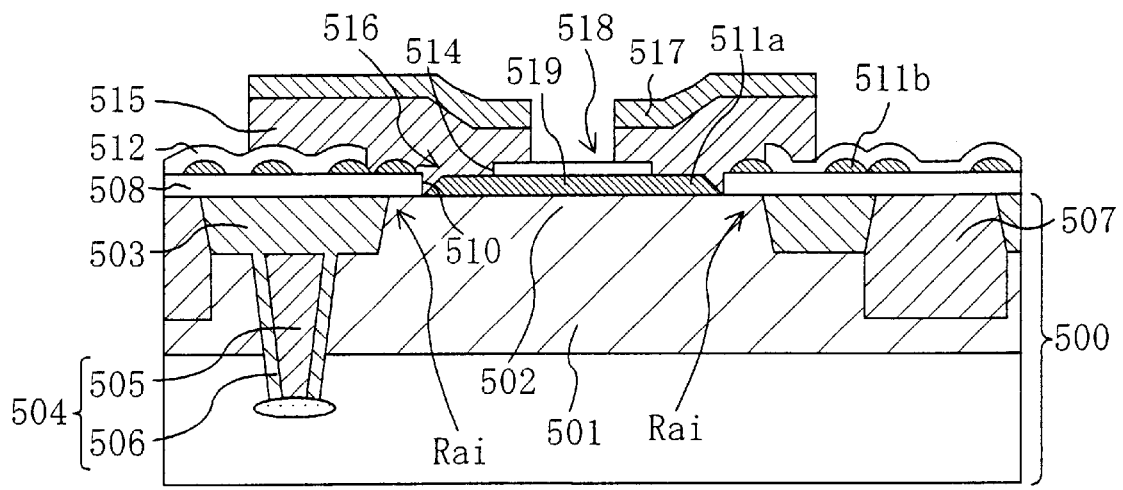
Figure 15A:
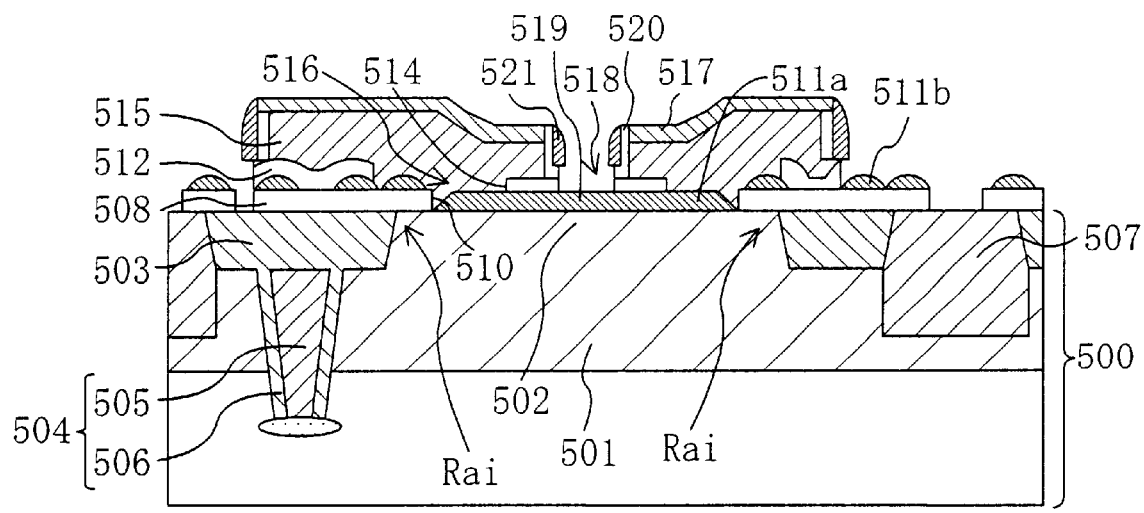
FIGS. 15(a) and 15(b) are cross-sectional views illustrating the steps of patterning the p+ polysilicon layer and forming a n+ polysilicon layer in the base opening in the fabrication process of the conventional semiconductor device.
Figure 15B:
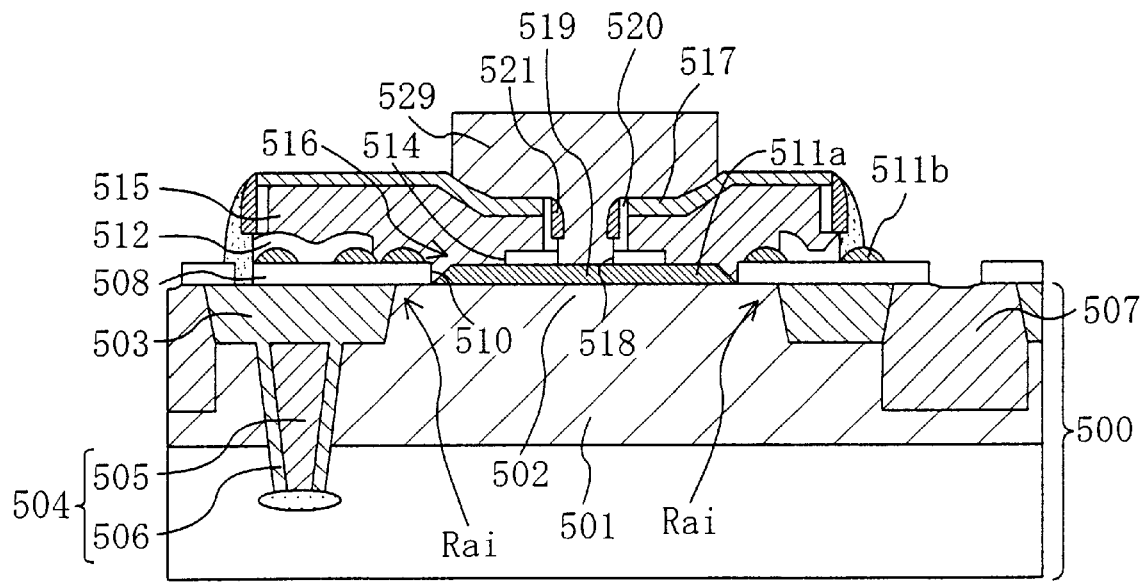
Figure 16:
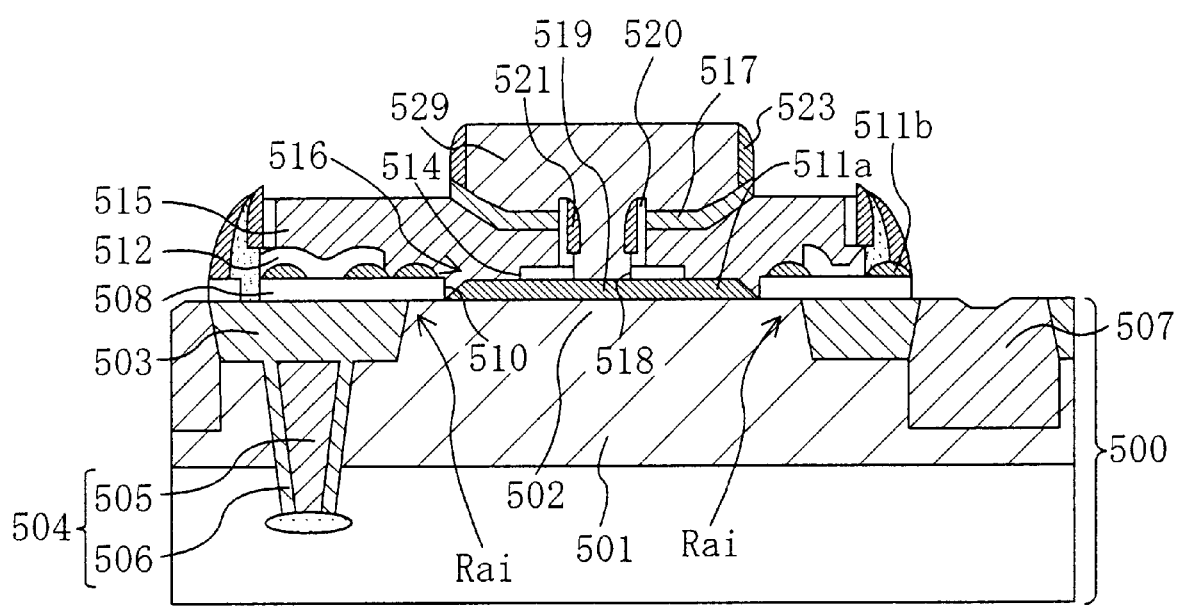
FIG. 16 is a cross-sectional view illustrating the step of forming sidewalls on the side faces of the polysilicon layers in the fabrication process of the conventional semiconductor device.

In the step shown in FIG. 3(b), the p$^+$ polysilicon layer 115 doped with impurities at a high density of about $1\times10^{20}$ atoms·cm$^{-3}$ or more is deposited to a thickness of about 150 nm and subsequently the third oxide film 117 is deposited to a thickness of about 100 nm, on the resultant wafer by CVD. The third oxide film 117 and the p$^+$ polysilicon layer 115 are then patterned by dry etching to form the base opening 118 at the centers thereof so as to reach the second oxide film 112. The base opening 118 is made smaller than the center portion of the second oxide film 112 so as not to overlap the base junction opening 114. Thus, in this step, the external base 116 composed of the p$^+$ polysilicon layer 115 and the portion of the Si/Si$_{1-x}$Ge$_x$ layer 111 excluding the center thereof is formed. In this embodiment, unlike the step of the conventional HBT fabrication process shown in FIG. 14(b), the side portions of the third oxide film 117 and the p$^+$ polysilicon layer 115 as viewed from the figure are left unetched, so as to minimize residues attaching to etched sidewalls.

Figure 4A:
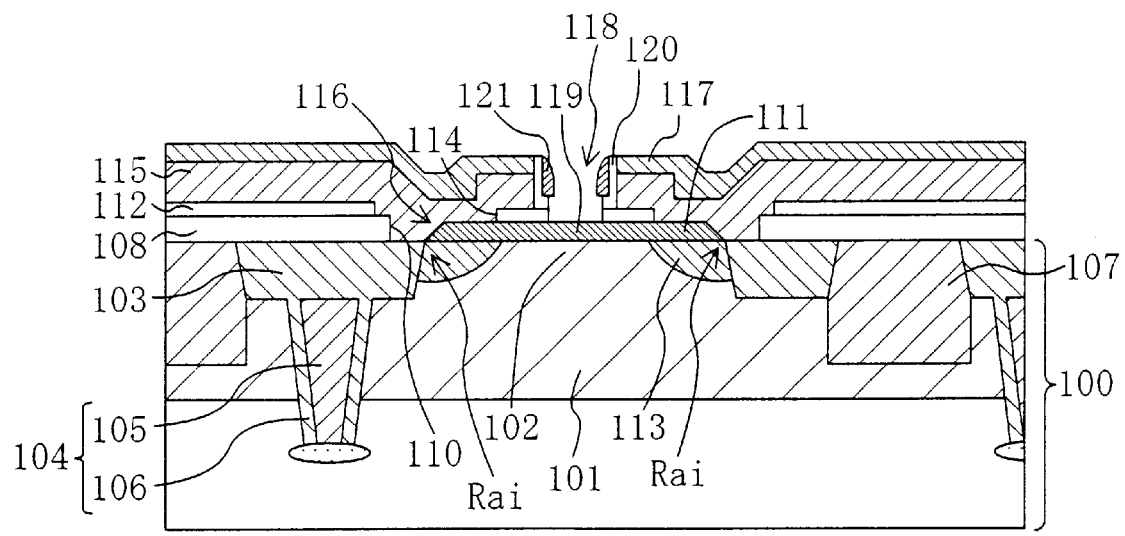
FIGS. 4(a) and 4(b) are cross-sectional views illustrating the steps of forming a $n^+$ polysilicon layer in the base opening in the fabrication process of the semiconductor device of EMBODIMENT 1.

In the step shown in FIG. 4(a), the fourth oxide film 120 having a thickness of about 30 nm and a polysilicon film having a thickness of about 150 nm are deposited by CVD on the entire surface of the resultant wafer. The polysilicon film is then etched back by anisotropic dry etching to form the sidewalls 121 made of polysilicon on the side faces of the p$^+$ polysilicon layer 115 and the third oxide film 117 via the fourth oxide films 120. The wafer is then subjected to wet etching with hydrofluoric acid to remove the exposed portions of the second oxide film 112 and the fourth oxide films 120. By this wet etching, the Si layer of the Si/Si$_{1-x}$Ge$_x$ layer 111 is exposed inside the base opening 118. In addition, since the wet etching is anisotropic, the second oxide film 112 and the fourth oxide film 120 are also etched in the transverse direction, resulting in increasing the size of the base opening 118. The width W1 of the base opening 118 is thus determined by this wet etching. In this embodiment, it is ensured that such a trouble that the surface of the Si substrate 100 is partly exposed will not occur during this wet etching even if SiGe islands exist on the first oxide film 108 since the n$^+$ collector drawing layer 107 and the like in the Si substrate 100 are covered with the p$^+$ polysilicon layer 115 and the like.

Figure 4B:
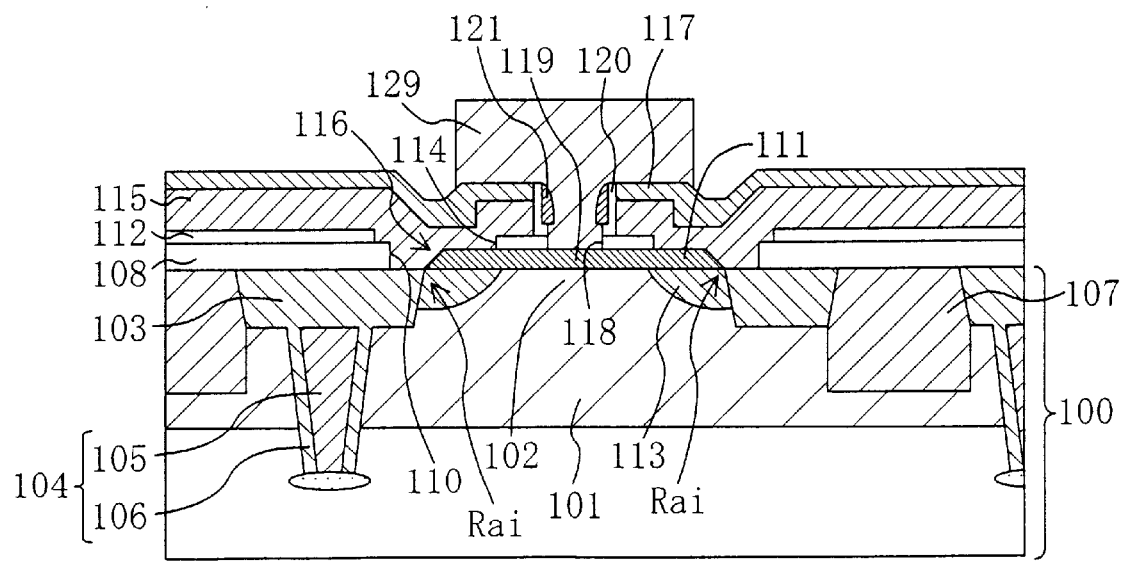

In the step shown in FIG. 4(b), the n$^+$ polysilicon layer 129 having a thickness of about 250 nm is deposited and patterned by dry etching to form the emitter drawing electrode. In this embodiment, since the side portions of the p$^+$ silicon layer 115 are not patterned, no sidewalls will be formed on the outer side faces during this dry etching. In addition, the surface of the n$^+$ collector drawing layer 107 and the like will not be etched by over-etching of the n$^+$ polysilicon layer 129, and thus the surface of the Si substrate 100 will not be made uneven.

Figure 5A:
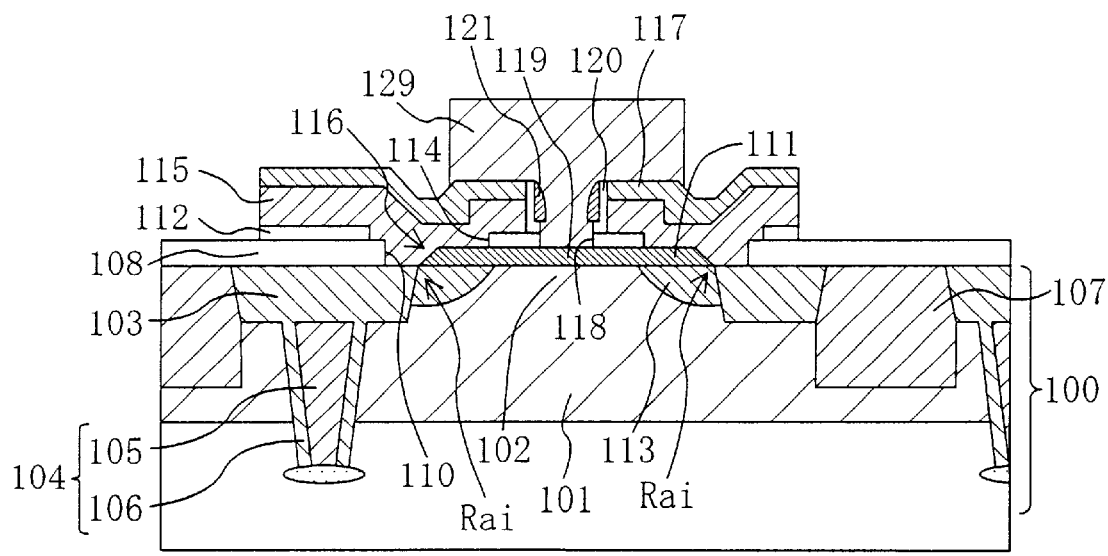
FIGS. 5(a) and 5(b) are cross-sectional views illustrating the steps of patterning the side faces of the $p^+$ polysilicon layer in the fabrication process of the semiconductor device of EMBODIMENT 1.

In the step shown in FIG. 5(a), the third oxide film 117, the p$^+$ polysilicon layer 115, and the second oxide film 112 are patterned by dry etching to define the profile of the external base 116.

Figure 5B:
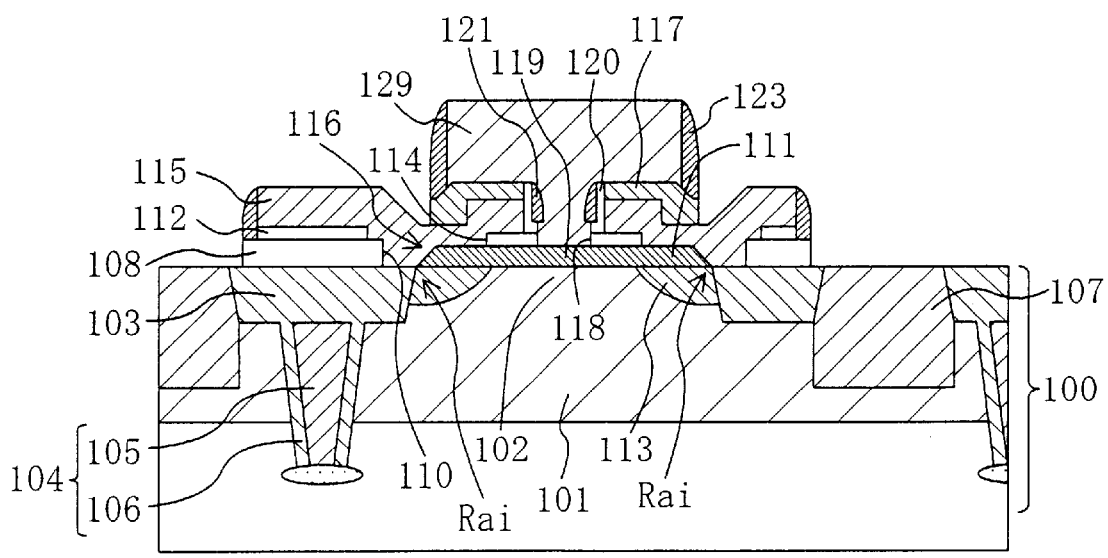

In the step shown in FIG. 5(b), an oxide film having a thickness of about 120 nm is deposited on the resultant wafer and dry-etched to form the sidewalls 123 on the side faces of the n$^+$ polysilicon layer 129 and the p$^+$ polysilicon layer 115. By this dry etching (over-etching), also, the exposed portions of the first oxide film 108 and the like are removed to expose the surfaces of the n$^+$ collector drawing layer 107, the n$^+$ polysilicon layer 129, and the p$^+$ polysilicon layer 115.

Thereafter, the following processing is performed to obtain the structure shown in FIG. 1. First, Ti is deposited to a thickness of about 40 nm on the entire surface of the resultant wafer by sputtering, and the resultant surface is subjected to RTA (rapid thermal annealing) at 675° C. for 30 seconds to form the Ti silicide layers 124 on the exposed surfaces of the n$^+$ polysilicon layer 129, the p$^+$ polysilicon layer 115, and the n$^+$ collector drawing layer 107. After selective removal of non-reacted portions of the Ti films, the resultant wafer is annealed to change the crystal structure of the Ti silicide layers 124.

The interlayer insulating film 125 is then formed over the entire surface of the wafer, and the contact holes are formed therethrough to reach the n$^+$ polysilicon layer 129, the p$^+$ polysilicon layer 115, and the n$^+$ collector drawing layer 107. The contact holes are then filled with W films to form the W plugs 126. An aluminum alloy film is then deposited on the entire surface of the wafer and patterned to form the metal interconnects 127 extending on the interlayer insulating film 125 to be connected with the W plugs 126.

By the process described above, the HBT having the structure shown in FIG. 1, that is, the HBT including the collector made of n-type Si, the base made of p$^+$-type Si$_{1-x}$Ge$_x$, and the emitter made of n$^+$-type Si is realized. It should be noted that the Si layer of the Si/Si$_{1-x}$Ge$_x$ layer 111 has been changed to an n$^+$-type Si layer with a high density of n-type impurities (phosphorus, etc.) diffused from the n$^+$ polysilicon layer 129.

By adopting the steps described above, the area of the HBT can be reduced. Furthermore, leak current due to stress at the active region-isolation junctions Rai, as well as leak current due to residual polysilicon sidewalls left on the outer side faces of the p$^+$ polysilicon layer 115 at dry etching, can be prevented.

Embodiment 2

Figure 6:
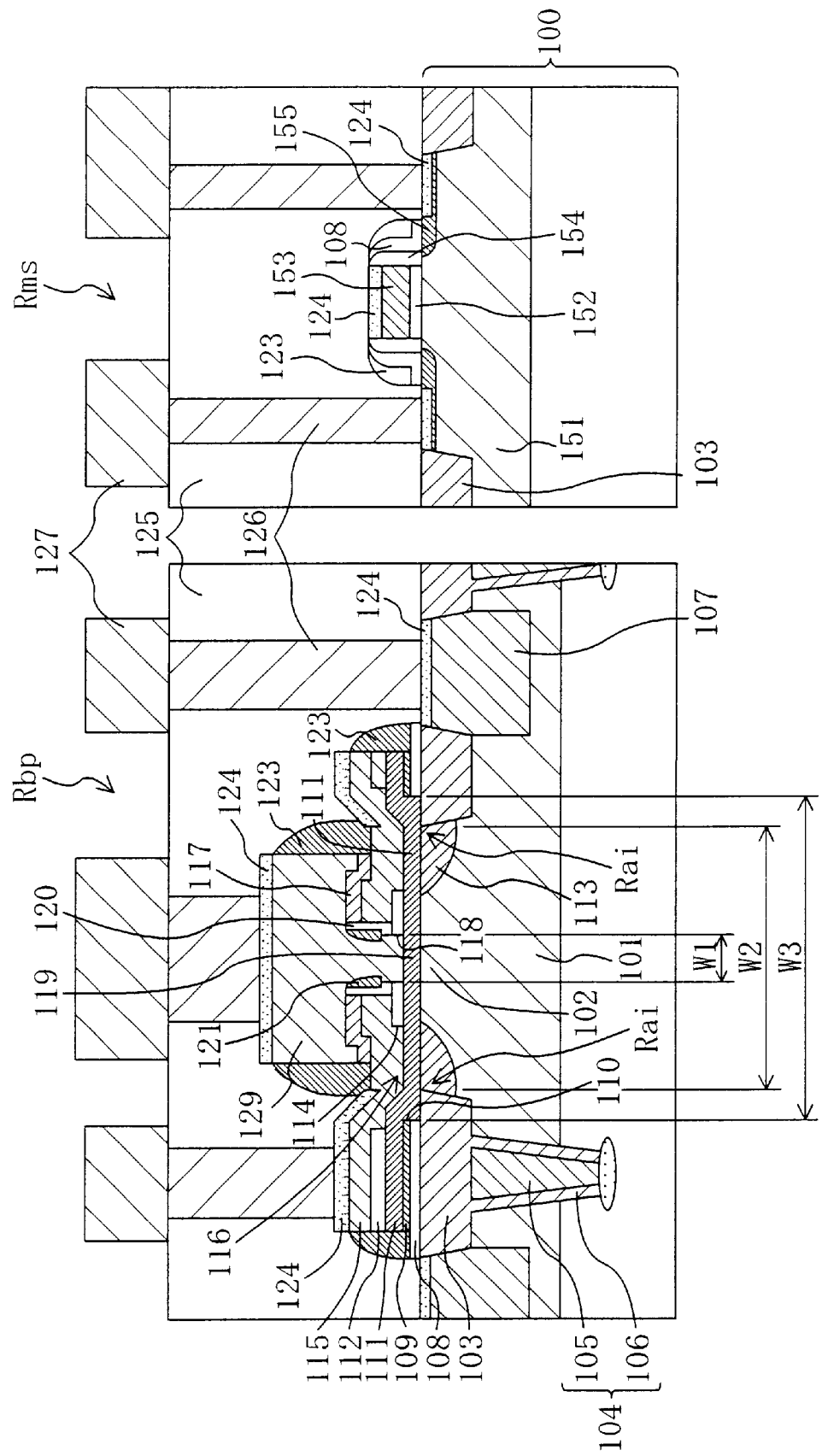
FIG. 6 is a cross-sectional view of a SiGe-BiCMOS device as a semiconductor device of EMBODIMENT 2 according to the present invention.

FIG. 6 is a cross-sectional view of a semiconductor device of EMBODIMENT 2 according to the present invention, particularly illustrating a SiGe-BiCMOS device fabricated in the procedure of forming first MISFET and thereafter HBT. In FIG. 6, one MISFET structure of the CMOS device region is shown in addition to the structure of the hetero bipolar transistor (HBT).

Referring to FIG. 6, the structure of the HBT in a HBT formation region Rbp in this embodiment is the same as that of the HBT in EMBODIMENT 1 described above, except for the structure located above the first oxide film 108. Hereinafter, description of the same components as those in EMBODIMENT 1 is omitted, and only the different points from EMBODIMENT 1 will be described.

In this embodiment, a polysilicon layer 109 is formed on the first oxide film 108, and the Si/Si$_{1-x}$Ge$_x$ layer 111 not only exists on the entire exposed surface of the Si substrate 100 inside the collector opening 110 but also extends over the polysilicon layer 109. This is the most important feature of this embodiment. The lower portion of the center of the Si/Si$_{1-x}$Ge$_x$ layer 111 serves as the internal base 119, while the portion of the Si/Si$_{1-x}$Ge$_x$ layer 111 excluding the center thereof and the p$^+$ polysilicon layer 115 serve as the external base 116.

The formation of the polysilicon layer 109 on the first oxide film 108 as an underlying layer of the Si/Si$_{1-x}$Ge$_x$ layer 111 prevents SiGe islands from being formed on the first oxide film 108 in a random distribution when the Si/Si$_{1-x}$Ge$_x$ layer 111 is formed by UHV-CVD or the like. A silicon nitride film may be used in place of the polysilicon layer 109.

In this embodiment, as in EMBODIMENT 1, the $Si_{1-x}Ge_x$ layer is mostly doped with p-type impurities such as boron (B) at about $2\times10^{18}$ atoms·cm$^{-3}$, while the Si layer is doped by diffusion of n-type impurities such as phosphorous (P) from the n$^+$ polysilicon layer 129 in the density distribution between $1\times10^{20}$ atoms·cm$^{-3}$ and $1\times10^{17}$ atoms·cm$^{-3}$. The Si layer is formed in succession on the $Si_{1-x}Ge_x$ layer so that the lower surface of the overlying n$^+$ polysilicon layer 129 be located farther from the pn junction so as to prevent recombination of carriers from being promoted by a number of interface states and defects existing in the n$^+$ polysilicon layer 129.

In this embodiment, as in EMBODIMENT 1, the shallow trenches 103 are formed so that the inner ends thereof are located within the range of the collector opening 110 in the HBT formation region Rbp, resulting in that the width W2 of the active region is smaller than the width W3 of the collector opening 110. With this arrangement, the entire area of the HBT can be reduced. In this embodiment, also, the p-type junction leak prevention layers 113 are formed in the vicinity of the active region-isolation junctions Rai by implanting p-type impurities in a self-aligned manner with respect to the collector opening 110. The density of impurities in the surface portions of the p-type junction leak prevention layers 113 is preferably about $3\times10^{17}$ atoms·cm$^{-3}$.

In a MISFET formation region Rms, there is provided a MISFET including: a retrograde well 151 formed by high-energy ion implantation in the Si substrate 100; a gate insulating film 152 made of silicon oxide or silicon nitride formed on the retrograde well 151; a gate electrode 153 made of polysilicon formed on the gate insulating film 152; sidewalls 154 made of a silicon oxide film formed on the side faces of the gate electrode 153; L-shaped portions of the first oxide film 108 and portions of the sidewalls 123 formed on the sidewalls 154; and source/drain regions 155 formed in the regions of the Si substrate 100 located on both sides of the gate electrode 153. If the MISFET is of the n-channel type, p-type impurities (e.g., boron) are introduced in the retrograde well 151, while n-type impurities (e.g., arsenic and phosphorous) with a high density are introduced in the source/drain regions 155. The Ti silicide layers 124 are formed on the surfaces of the gate electrode 153 and the source/drain regions 155. Contact holes are formed through the interlayer insulating film 125 so as to reach the gate electrode 153 and the source/drain regions 155. The contact holes are filled with W plugs 126, and metal interconnects 127 extend on the interlayer insulating film 125 so as to be in contact with the W plugs 126.

In this embodiment, the $Si/Si_{1-x}Ge_x$ layer 111 is formed over the first oxide film 108 roughly uniformly in the HBT formation region Rbp with no SiGe islands being formed.

Therefore, in this embodiment, in addition to the effects described in EMBODIMENT 1, the effect of avoiding the conventional problems relating to the formation of SiGe islands is obtained.

Hereinafter, the fabrication process for realizing the structure shown in FIG. 6 will be described with reference to FIGS. 7(a) and 7(b) through 11(a) and 11(b), which are cross-sectional views illustrating the steps of the fabrication method of t he SiGe-BiCMOS device of EMBODIMENT 2.

Figure 7A:
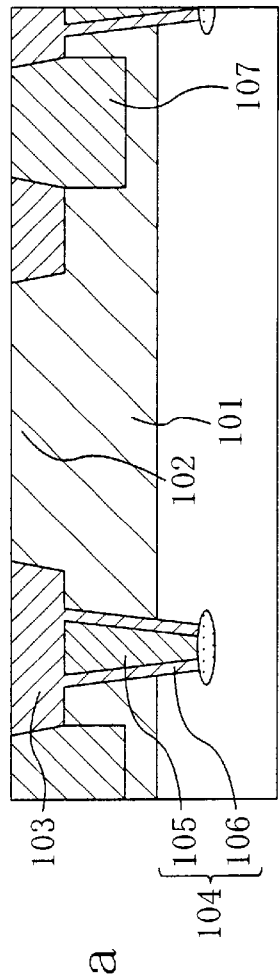
FIGS. 7(a) and 7(b) are cross-sectional views illustrating the steps of forming a gate electrode and other components of MISFET in the fabrication process of the semiconductor device of EMBODIMENT 2.
Figure 7A:
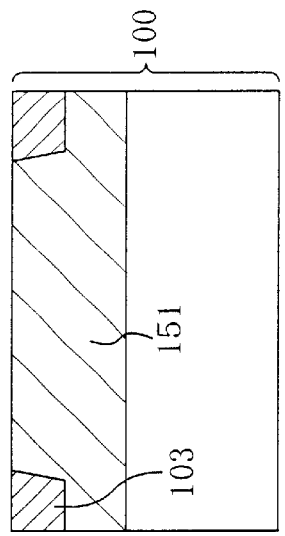

In the step shown in FIG. 7(a), a Si single-crystalline layer is grown by epitaxy while being doped with n-type impurities, or grown by epitaxy followed by high-energy ion implantation, to form the n- type retrograde well 101 having a depth of about 1 μm in the upper portion of the Si (001) substrate 100 in the HBT formation region Rbp.

Alternatively, the retrograde well 101 may be formed by merely implanting ions in part of the Si substrate 100 without involving the epitaxial growth. In either case, the density of the n-type impurities in the surface region of the Si substrate 100 in the HBT formation region Rbp should be adjusted to about $1\times10^{17}$ atoms·cm$^{-3}$ so that the surface region can serve as the collector layer of the HBT. In the MISFET formation region Rms, the retrograde well 151 is formed by ion implantation. The retrograde well 151 is a p-type well if a nMISFET is to be formed, while it is an n-type well if a pMISFET is to be formed.

Thereafter, the shallow trench 103 filled with silicon oxide and the deep trench 104 composed of the undoped polysilicon film 105 and the silicon oxide film 106 surrounding the undoped polysilicon film 105 are formed as the device isolation so as to have depths of about 0.35 μm and 2 μm respectively. The region sandwiched by the adjacent shallow trenches 103 is defined as the collector layer 102. The n$^+$ collector drawing layer 107 is formed in the region of the Si substrate 100 isolated from the collector layer 102 by the shallow trench 103 for securing contact with a collector electrode. In this step, the width W2 of the active region is determined by the distance between the adjacent shallow trenches 103. In this embodiment, the width W2 of the active region is made smaller than that of the conventional HBT. The shallow trenches 103 having the same depth are also formed in the MISFET formation region Rms.

Figure 7B:
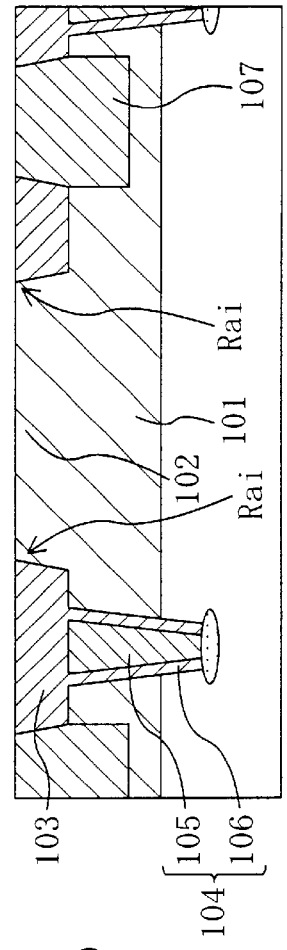
Figure 7B:
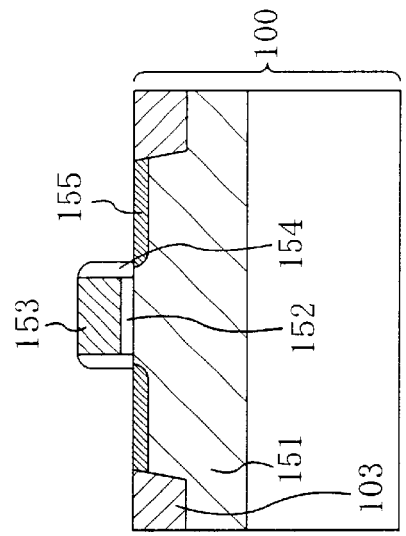

In the step shown in FIG. 7(b), the gate insulating film 152, the gate electrode 153, the oxide film sidewalls 154, the source/drain regions 155, and the like constituting each MISFET of the CMOS device are formed by a normal fabrication method.

Figure 8A:
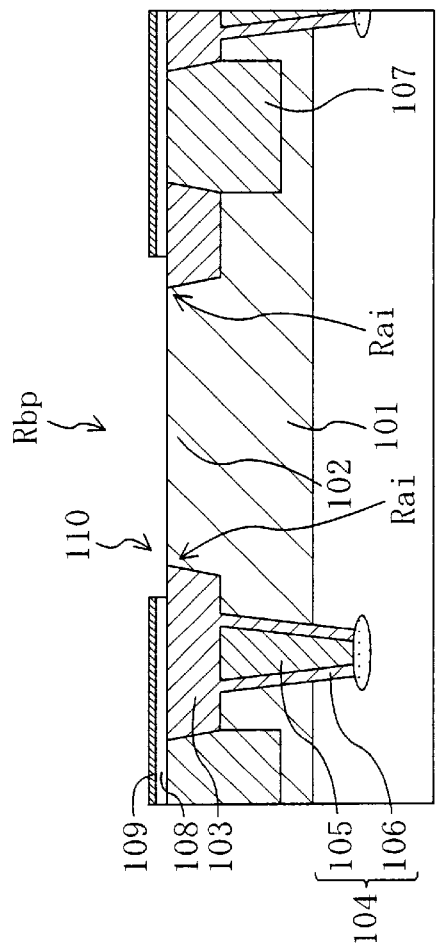
FIGS. 8(a) and 8(b) are cross-sectional views illustrating the steps of forming a first insulating film, a polysilicon layer, and a $Si/Si_{1-x}Ge_x$ layer in the fabrication process of the semiconductor device of EMBODIMENT 2.

In the step shown in FIG. 8(a), the first oxide film 108 having a thickness of about 30 nm is formed by CVD using tetraethoxysilane (TEOS) and oxygen at a temperature of 680° C., and sequentially the polysilicon layer 109 having a thickness of about 50 nm is formed. Thereafter, the polysilicon layer 109 is patterned by dry etching or the like, and then the first oxide film 108 is wet-etched with hydrofluoric acid or the like, to form the collector opening 110 having the width W3 that is larger than the width W2 of the active region through the first oxide film 108 and the polysilicon layer 109 in the HBT formation region Rbp. That is, the collector opening 110 is made wider than the active region by forming the collector opening 110 so that the active region-isolation junctions Rai (boundaries between the shallow trenches 103 and the surface portion of the Si substrate 100) are located within the range of the collector opening 110. In fact, the width of the collector opening 110 is substantially the same as that of the conventional HBT. As a result that the distance between the shallow trenches 103 is made smaller than that of the conventional HBT, the width W3 of the collector opening 110 becomes relatively larger than the width W2 of the active region. This arrangement however may cause the problem of increased base-collector leak current due to stress generated at the junction of different materials if no measures are taken. In order to avoid this problem, the junction leak prevention layers 113 are formed as will be described later.

In the MISFET formation region Rms, also, the first oxide film 108 and the polysilicon layer 109 are formed on the Si substrate 100 covering the sidewalls 154 and the gate electrode 153. The first oxide film 108 and the polysilicon layer 109 in this region are left as they are without being patterned.

Figure 8B:
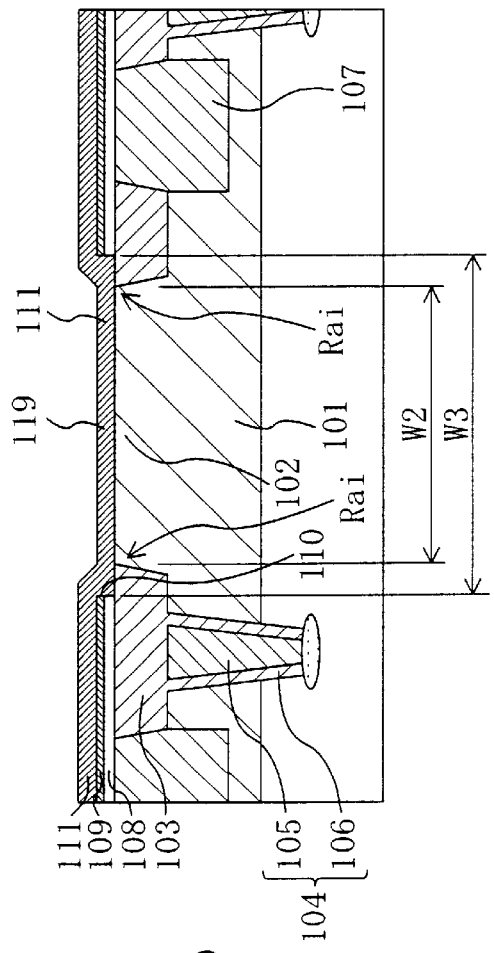

In the step shown in FIG. 8(b), the portion of the surface of the Si substrate 100 exposed inside the collector opening 110 is treated with a mixture of ammonium hydroxide and hydro peroxide to form a protection oxide film having a thickness of about 1 nm on the exposed portion. The resultant wafer in this state is placed in a chamber of a UHV-CVD apparatus, where the wafer is heat-treated in a hydrogen atmosphere to remove the protection oxide film and then a gas of disilane ($Si_2H_6$) and germane ($GeH_4$) containing diboran ($B_2H_6$) for doping is introduced into the chamber while heating to 550° C., to allow the $Si_{1-x}Ge_x$ layer to be grown by epitaxy to a thickness of about 60 nm over the area covering the exposed surface of the Si substrate 100 inside the collector opening 110 and the polysilicon layer 109. Subse-opening 110 and the polysilicon layer 109. Subsequent to the formation of the $Si_{1-x}Ge_x$ layer, the supply gas to the chamber is changed to disilane, to grow the Si layer having a thickness of about 10 nm by epitaxy on the $Si_{1-x}Ge_x$ layer, thereby forming the Si /$Si_{1-x}Ge_x$ layer 111. In the MISFET formation region Rms, also, the Si/$Si_{1-x}Ge_x$ layer 111 is formed on the polysilicon layer 109. At this time, while the $Si_{1-x}Ge_x$ layer doped with boron (B) is of the p-type having a boron density of about $2\times10^{18}$ atoms·$cm^{-3}$, the Si layer is not doped with impurities.

Figure 13A:
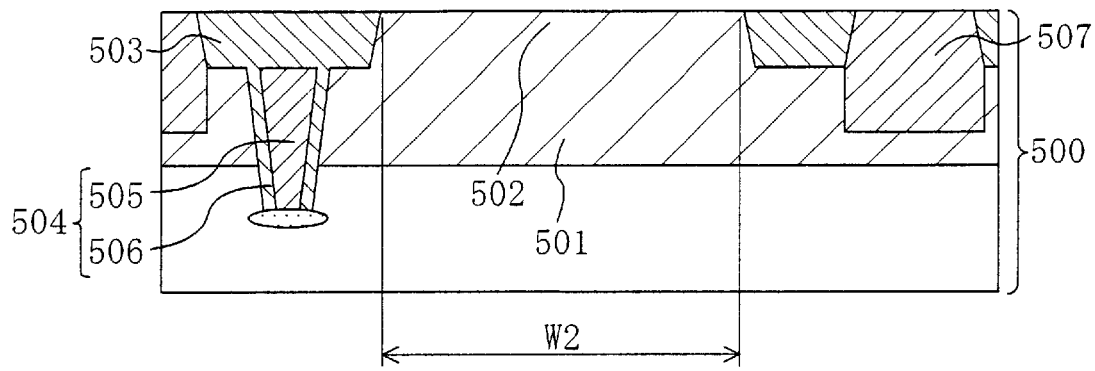
FIGS. 13(a) and 13(b) are cross-sectional views illustrating the steps of forming a $Si/Si_{1-x}Ge_x$ layer in a collector opening in the fabrication process of the conventional semiconductor device.
Figure 13B:
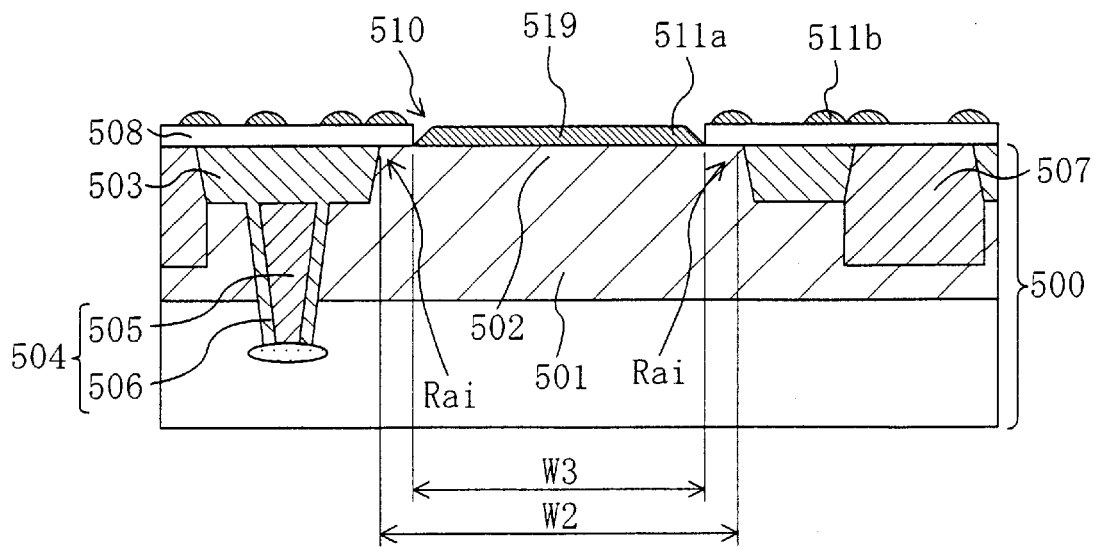
Figure 17A:
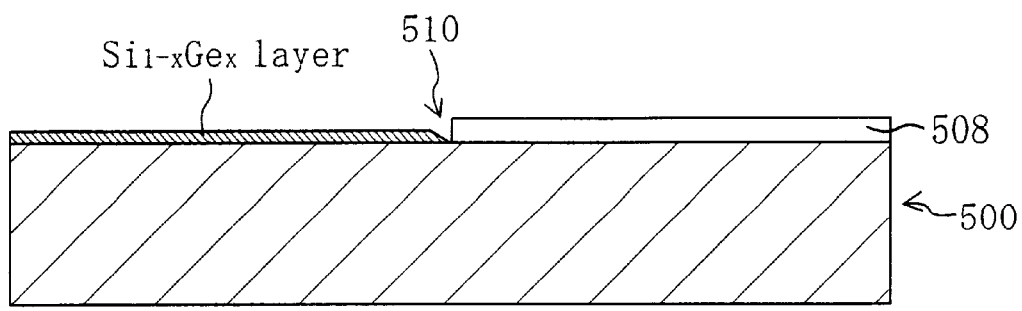
FIGS. 17(a) through 17(c) are cross-sectional views illustrating generation of SiGe islands in the fabrication process of the conventional bipolar transistor.
Figure 17B:
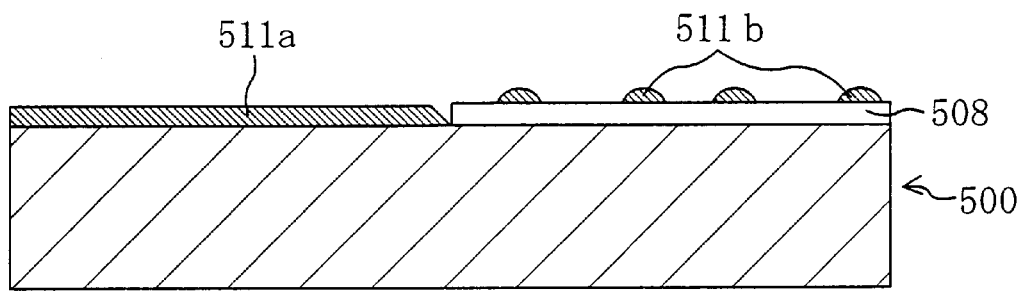
Figure 17C:
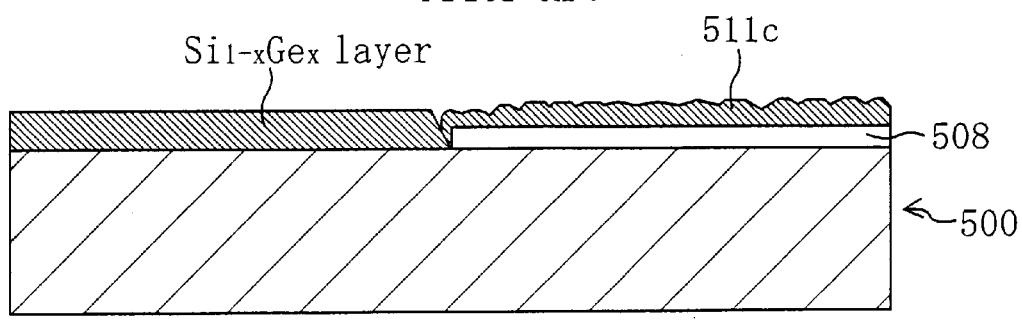

In the formation of the Si/$Si_{1-x}Ge_x$ layer 111 by UHV-CVD, in the conventional fabrication technique, the SiGe islands S11b are formed on the first oxide film 508 since Si and Ge atoms supplied on the first oxide film 508 fail to form a uniform film (see FIGS. 13(b) and 17(b)). In this embodiment, however, with the polysilicon layer 109 formed on the first oxide film 108, no SiGe islands will be formed even if the strict conditions for selective growth fail to be satisfied. More precisely, while a single-crystalline Si/$Si_{1-x}Ge_x$ layer is formed on the exposed portion of the Si substrate 100 inside the collector opening 110, a uniform polycrystalline Si/$Si_{1-x}Ge_x$ layer is formed on the polysilicon layer 109 in the HBT formation region Rbp and the MISFET formation region Rms. Likewise, while a single-crystalline Si layer is formed on the Si/$Si_{1-x}Ge_x$ layer inside the collector opening 110, a polycrystalline Si layer is formed above the polysilicon layer 109 in the HBT formation region Rbp and the MISFET formation region Rms.

In the step shown in FIG. 9(a), the second oxide film 112 having a thickness of 30 nm as an etch stopper is formed on the resultant wafer, and then patterned by dry etching using a resist mask Re2 formed on the second oxide film 112 to form the base junction openings 114 in the HBT formation region Rbp. As a result, the center of the Si/$Si_{1-x}Ge_x$ layer 111 is covered with the second oxide film 112, while the portions of the Si/$Si_{1-x}Ge_x$ layer 111 are exposed inside the base junction opening 114. Thereafter, p-type impurities such as boron (B) are implanted using the resist mask Re2 used for the formation of the base junction openings 114, to form the junction leak prevention layers 113 having a density of the impurities of about $3\times10^{17}$ atoms·$cm^{-3}$ in the surface portion as the measures for minimizing the influence of stress at the active region-isolation junctions Rai in the HBT formation region Rbp.

In the step shown in FIG. 9(b), the p⁺ polysilicon layer 115 doped with impurities at a high density of about $1\times10^{20}$ atoms·$cm^{-3}$ or more is deposited to a thickness of about 150 nm and subsequently the third oxide film 117 is deposited to a thickness of about 100 nm, on the resultant wafer by CVD. The third oxide film 117 and the p⁺ polysilicon layer 115 in the HBT region Rbp are then patterned by dry etching to form the base opening 118 at the centers thereof so as to reach the second oxide film 112. The base opening 118 is made smaller than the center portion of the second oxide film 112 so as not to overlap the base junction openings 114.

Thus, in this step, the external base 116 composed of the p⁺ polysilicon layer 115 and the portion of the Si/$Si_{1-x}Ge_x$ layer 111 excluding the center thereof is formed. In this embodiment, as in EMBODIMENT 1, unlike the step for the conventional HBT shown in FIG. 14(b), the side portions of the third oxide film 117, the p⁺ polysilicon layer 115, the Si/$Si_{1-x}Ge_x$ layer 111, and the polysilicon layer 109 as viewed from the figure are left unetched. By doing this, as in EMBODIMENT 1, the problem caused by residual n⁺ polysilicon left on the side faces of the p⁺ polysilicon layer 115 and the like can be prevented. In addition, it is possible to prevent the MISFET formation region and the like from being polluted with Ge that may otherwise come from the exposed faces of the Si/$Si_{1-x}Ge_x$ layer. The third oxide film 117 and the p⁺ polysilicon layer 115 in the MISFET formation region Rms are entirely left unetched.

In the step shown in FIG. 10(a), the fourth oxide film 120 having a thickness of about 30 nm and a polysilicon film having a thickness of about 150 nm are deposited by CVD on the entire surface of the resultant wafer. The polysilicon film is then etched back by anisotropic dry etching to form the sidewalls 121 made of polysilicon on the side faces of the p⁺ polysilicon layer 115 and the third oxide film 117 in the HBT formation region Rbp via the fourth oxide films 120. The fourth oxide films 120 and the polysilicon film in the MISFET formation region Rms are entirely removed. The wafer is then subjected to wet etching with hydrofluoric acid to remove the exposed portions of the second oxide film 112 and the fourth oxide films 120. By this wet etching, the Si layer of the Si/$Si_{1-x}Ge_x$ layer 111 is exposed inside the base opening 118. In addition, since the wet etching is anisotropic, the second oxide film 112 and the fourth oxide film 120 are also etched in the transverse direction, resulting in increasing the size of the base opening 118. The width W1 of the base opening 118 is thus determined by this wet etching. In this embodiment, the surface of the Si substrate 100 is protected from being exposed during this wet etching since the n⁺ collector drawing layer 107 and the like in the Si substrate 100 are covered with the p⁺ polysilicon layer 115 and the like.

In the step shown in FIG. 10(b), the n⁺ polysilicon layer 129 having a thickness of about 250 nm is deposited, and the n⁺ polysilicon layer 129 and the third oxide film 117 are patterned by dry etching to form the emitter drawing electrode only in the HBT formation region Rbp. In the MISFET formation region Rms, the n⁺ polysilicon layer 129 and the third oxide film 117 are completely removed. In this embodiment, since the outer portions of the p⁺ silicon layer 115 are not patterned, no sidewalls will be formed on the outer sides of the p⁺ silicon layer 115 during this dry etching. In addition, the surface of the n⁺ collector drawing layer 107 and the like will not be etched by over-etching of the n⁺ polysilicon layer 129, and thus the surface of the Si substrate 100 will not be made uneven.

In the step shown in FIG. 11(a), the p⁺ polysilicon layer 115, the second oxide film 112, the Si/$Si_{1-x}Ge_x$ layer 111, and the polysilicon layer 109 are patterned by dry etching to define the profile of the external base 116. In the MISFET formation region Rms, the p⁺ polysilicon layer 115, the second oxide film 112, the Si/$Si_{1-x}Ge_x$ layer 111, and the polysilicon layer 109 are all removed.

In the step shown in FIG. 11(b), an oxide film having a thickness of about 120 nm is deposited on the resultant wafer and dry-etched to form the sidewalls 123 on the side faces of the n⁺ polysilicon layer 129 and the p⁺ polysilicon layer 115 in the HBT formation region Rbp. In the MISFET formation region Rms, the sidewalls 123 are deposited on the L-shaped portions of the first oxide film 108 on the sidewalls 154 of the gate electrode 153. By this dry etching (over-etching), also, the exposed portions of the first oxide film 108 and the like are removed to expose the surfaces of the n+ polysilicon layer 129, the p+ polysilicon layer 115, and the n+ collector drawing layer 107 in the HBT formation region Rbp and the surfaces of the gate electrode 153 and the source/drain regions 155 in the MISFET formation region Rms.

Thereafter, the following processing is performed to obtain the structure shown in FIG. 6. First, Ti is deposited to a thickness of about 40 nm on the entire surface of the resultant wafer by sputtering, and the resultant surface is subjected to RTA (rapid thermal annealing) at 675° C. for 30 seconds to form the Ti silicide layers 124 on the exposed surfaces of the n+ polysilicon layer 129, the p+ polysilicon layer 115, and the n+ collector drawing layer 107 in the HBT formation region Rbp and the exposed surfaces of the gate electrode 153 and the source/drain regions 155 in the MISFET formation region Rms. After selective removal of non-reacted portions of the Ti films, the resultant wafer is annealed to change the crystal structure of the Ti silicide layers 124.

The interlayer insulating film 125 is then formed over the entire surface of the wafer, and the contact holes are formed therethrough to reach the n+ polysilicon layer 129, the p+ polysilicon layer 115, and the n+ collector drawing layer 107 in the HBT formation region Rbp and the gate electrode 153 and the source/drain regions 155 in the MISFET formation region Rms. The contact holes are then filled with W films to form the W plugs 126. An aluminum alloy film is then deposited on the entire surface of the wafer and patterned to form the metal interconnects 127 extending on the interlayer insulating film 125 to be connected with the W plugs 126.

By the process described above, the HBT and MISFET having the structures shown in FIG. 6, that is, the HBT including the collector made of n-type Si, the base made of p+-type $Si_{1-x}Ge_x$, and the emitter made of n+-type Si and the MISFET including the gate insulating film, the polysilicon gate electrode, and the source/drain regions, are realized. It should be noted that the Si layer of the $Si/Si_{1-x}Ge_x$ layer 111 has been changed to an n+-type Si layer with a high density of n-type impurities (phosphorus, etc.) diffused from the n+ polysilicon layer 129.

In this embodiment, in addition to the effect obtained in EMBODIMENT 1 described above, the following effect can be obtained.

In the conventional fabrication method of a SiGe-BiCMOS device, it is attempted to selectively grow the $Si_{1-x}Ge_x$ layer on the portion of the substrate inside the collector opening 110 in the HBT formation region. For this selective growth, strict conditions must be satisfied. In the actual steps, therefore, SiGe islands are often generated on the first oxide film 108, causing various problems. In the fabrication method in this embodiment, however, the polysilicon layer 109 is formed on the first oxide film 108 before the $Si_{1-x}Ge_x$ layer is grown by epitaxy on the exposed surface of the substrate inside the collector opening 110. By the existence of the polysilicon layer 109, a polycrystalline $Si_{1-x}Ge_x$ layer having a roughly uniform thickness is deposited on the polysilicon layer 109 without fail, irrespective of whether or not the selective epitaxial growth conditions are satisfied. Therefore, no SiGe islands will be formed, and thus unevenness of the surfaces of the substrate and the second oxide film 112 is minimized without fail.

(Other Embodiments)

In the above embodiments, the $Si_{1-x}Ge_x$ layer may be replaced with another film made of a material containing Si other than the Si material, such as $Si_{1-x-y}Ge_xC_y$ ($0 \leq x+y \leq 1$) and $Si_{1-y}C_y$ ($0 \leq y \leq 1$). Alternatively, a laminated film composed of two or more of the $Si_{1-x}Ge_x$ layer, the $Si_{1-x-y}Ge_xC_y$ layer, the $Si_{1-y}C_y$ layer, and the like may be used.

The bipolar transistors in the above embodiments are not necessarily limited to the hetero bipolar transistor. Reducing the transistor area and minimizing leak at junctions are also challenges to be addressed for bipolar transistors using a Si layer grown by homo-epitaxy as a base. The conditions for selective epitaxial growth for these bipolar transistors are also unstable, generating islands in some cases.

The steps of the fabrication method of the bipolar transistor according to the present invention are not limited to the specific steps disclosed in the above embodiments. For example, the Si emitter layer can also be formed in other ways. For example, the $Si_{1-x}Ge_x$ layer may be formed in place of the $Si/Si_{1-x}Ge_x$ layer and thereafter the Si layer may be grown by epitaxy only on the portion of the $Si_{1-x}Ge_x$ layer exposed inside the base opening. The fourth oxide film 120 and the sidewall 121 may also be formed in a manner other than that disclosed in the above embodiments. It would be understood that in the actual formation of the other components, also, other known methods capable of forming components having functions equivalent to those provided by the intended components might be employed.

In EMBODIMENT 2, the polysilicon layer 109 formed on the first oxide film 108 may be replaced with a film made of another material that allows the $Si_{1-x}Ge_x$ layer, the $Si_{1-x-y}Ge_xC_y$ layer, or the $Si_{1-y}C_y$ layer to be selectively grown thereon. A film for selective growth is formed preferentially on an underlying layer having a function of reducing the source gas. Accordingly, films having the reduction function, such as an amorphous silicon film and a silicon nitride film, can be used in place of the polysilicon layer.

In the above embodiments, all the oxide films are preferably silicon oxide films formed at a temperature of 700° C. or lower. This minimizes degradation of the density profile of impurities in the relevant components of the semiconductor device.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A method for fabricating a semiconductor device serving as a bipolar transistor having an emitter layer, a base layer, and a collector layer formed at an active region of a semiconductor substrate, the method comprising the steps of:

(a) forming device isolation regions in portions of the semiconductor substrate for surrounding the active region;

(b) forming a collector layer of a first conductivity type in a region of the semiconductor substrate sandwiched by the device isolation regions;

(c) after the steps (a) and (b), depositing a first insulating layer on the semiconductor substrate, thereafter removing a portion of the first insulating layer and forming a collector opening whose periphery is located on the device isolation regions so that the range of the collector opening covers the collector layer and portions of the device isolation regions; and (d) forming a semiconductor layer of a second conductivity type on the portion of the semiconductor substrate located inside the collector opening for defining at least an internal base and an external base surrounding the internal base.

2. The method of claim 1, further comprising the steps of:
(e) after the step (d), forming a second insulating layer on the semiconductor substrate, and then forming base junction openings by removing portions of the second insulating layer ranging from positions located above peripheries of the semiconductor layer to positions located above inner ends of the device isolation regions while remaining a portion of the second insulating layer located above a center of the semiconductor layer, by etching using a patterned photoresist; and
(f) forming junction leak prevention layers by introducing impurities of the second conductivity type in regions of the semiconductor substrate located under the base junction openings.

3. The method of claim 1, further comprising the steps of:
(e) after the step (d), forming a second insulating layer on the semiconductor substrate, and then forming base junction openings by removing portions of the second insulating layer located above peripheries of the semiconductor layer while remaining a portion of the second insulating layer located above a center of the semiconductor layer, by etching using a patterned photoresist;
(f) depositing a first conductor layer and a third insulating layer on the semiconductor substrate, and then forming a base opening through the first conductor layer and the third insulating layer to reach a portion of the second insulating layer left on the internal base;
(g) forming a fourth insulating layer covering a side face of the first conductor layer exposed in the base opening;
(h) removing a portion of the second insulating layer left on the internal base of the semiconductor layer exposed inside the base opening to expose a portion of the semiconductor layer on the bottom of the base opening;
(i) after the step (h), forming a second conductor layer burying the base opening; and
(j) after the step (i), removing side portions of the first conductor layer and the third insulating layer by etching to expose a portion of the semiconductor substrate to be used as a collector drawing layer.

4. A method for fabricating a semiconductor device including a bipolar transistor having at least an emitter layer, a base layer, and a collector layer and MISFET having at least a gate insulating film, a gate electrode, and source/drain regions, formed on a semiconductor substrate, the method comprising the steps of:
(a) forming the collector layer of the bipolar transistor in a bipolar transistor formation region and forming the gate insulating film, the gate electrode, and the source/drain regions of the MISFET in a MISFET formation region;
(b) depositing a first insulating layer and a reductive film on the semiconductor substrate for protecting a region other than the bipolar transistor formation region, and then removing a portion of the first insulating layer and the reductive film located above the collector layer in the bipolar transistor formation region to form a collector opening; and
(c) growing by epitaxy a semiconductor layer of a second conductivity type on a portion of the semiconductor substrate located inside the collector opening and the reductive film for forming at least an internal base and an external base surrounding the internal base.

5. The method of claim 4, wherein in the step (c) the semiconductor layer is formed so as to include at least one of $Si_{1-x}Ge_x$ ($0 \leq x \leq 1$), $Si_{1-x-y}Ge_xC_y$ ($0 \leq x+y \leq 1$), and $Si_{1-y}C_y$ ($0 \leq y \leq 1$).

6. The method of claim 4, wherein in the step (b) the reductive film is formed to include one material selected from the group consisting of polysilicon, amorphous silicon, and silicon nitride.

7. The method of claim 4, further comprising the steps of:
(d) after the step (c), forming a second insulating layer on the semiconductor substrate, and then removing portions of the second insulating layer located above peripheries of the semiconductor layer while remaining a portion of the second insulating layer located above a center of the semiconductor layer to form base junction openings;
(e) depositing a first conductor layer and a third insulating layer on the semiconductor substrate, and then forming a base opening through portions of the first conductor layer and the third insulating layer to reach a portion of the second insulating layer left on the internal base;
(f) forming an inter-electrode insulating layer covering a side face of the first conductor layer exposed in the base opening;
(g) removing a portion of the second insulating layer left on the internal base of the semiconductor layer exposed in the base opening by etching to expose a portion of the semiconductor layer on the bottom of the base opening;
(h) forming a second conductor layer to be used as an emitter drawing electrode burying the base opening;
(i) removing part of the third insulating layer, the first conductor layer, the semiconductor layer, and the reductive film in the bipolar transistor formation region, and the entire of the third insulating layer, the first conductor layer, the semiconductor layer, and the reductive film in the MISFET formation region;
(j) after the step (i), depositing an insulating film on the semiconductor substrate and etching back the insulating film to form sidewalls on side faces of the first conductor layer, the semiconductor layer, and the reductive film in the bipolar transistor formation region and on the side faces of the gate electrode in the MISFET formation region; and
(k) removing the first insulating layer to expose portions of the semiconductor substrate to be used as a collector drawing layer in the bipolar transistor formation region and the source/drain regions in the MISFET formation region.

8. The method of claim 7, wherein the steps (j) and (k) are performed simultaneously.

9. The method of claim 4, wherein at least one of the insulating layers comprises a silicon oxide film formed at a temperature of 700° C. or lower.

10. The method of claim 4, wherein in the step (c) the semiconductor layer is formed by sequentially depositing a layer made of at least one of $Si_{1-x}Ge_x$ ($0 \leq x \leq 1$), $Si_{1-x-y}Ge_xC_y$ ($0 \leq x+y \leq 1$), and $Si_{1-y}C_y$ ($0 \leq y \leq 1$) and a Si layer, and the method further comprises the steps of:
(d) after the step (c), forming a second insulating layer on the semiconductor substrate, and then removing portions of the second insulating layer located above peripheries of the semiconductor layer while remaining a portion of the second insulating layer located above a center of the semiconductor layer to form base junction openings;

(e) depositing a first conductor layer and a third insulating layer on the semiconductor substrate, and then forming a base opening through portions of the first conductor layer and the third insulating layer to reach a portion of the second insulating layer left on the internal base;

(f) forming an inter-electrode insulating layer covering a side face of the first conductor layer exposed in the base opening;

(g) removing a portion of the second insulating layer left on the internal base of the semiconductor layer exposed in the base opening by etching to expose a portion of the semiconductor layer on the bottom of the base opening;

(h) after the step (g), forming a second conductor layer to be used as an emitter drawing electrode burying the base opening; and (i) diffusing impurities of a first conductivity type to part of the Si layer from the second conductor layer to form an emitter layer in the Si layer.

11. The method of claim 10, further comprising the steps of:

(j) removing part of the third insulating layer, the first conductor layer, the semiconductor layer, and the reductive film in the bipolar transistor formation region, and the entire of the third insulating layer, the first conductor layer, the semiconductor layer, and the reductive film in the MISFET formation region;

(k) after the step (j), depositing an insulating film on the semiconductor substrate and etching back the insulating film to form sidewalls on side faces of the first conductor layer, the semiconductor layer, and the reductive film in the bipolar transistor formation region and on the side faces of the gate electrode in the MISFET formation region; and (l) removing the first insulating layer to expose portions of the semiconductor substrate to be used as a collector drawing layer in the bipolar transistor formation region and the source/drain regions in the MISFET formation region.

12. The method of claim 11, wherein the steps (k) and (l) are performed simultaneously.

* * * * *